US012564041B2

(12) United States Patent
Do et al.

(10) Patent No.: US 12,564,041 B2
(45) Date of Patent: Feb. 24, 2026

(54) SEMICONDUCTOR DEVICE

(71) Applicant: Samsung Electronics Co., Ltd.,
Suwon-si (KR)

(72) Inventors: Jung Ho Do, Suwon-si (KR); Ji Su Yu,
Suwon-si (KR); Jae Ha Lee, Suwon-si
(KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 535 days.

(21) Appl. No.: 18/153,550

(22) Filed: Jan. 12, 2023

(65) Prior Publication Data

US 2023/0335492 A1      Oct. 19, 2023

(30) Foreign Application Priority Data

Apr. 18, 2022      (KR) ........................ 10-2022-0047381
Aug. 4, 2022      (KR) ........................ 10-2022-0097152

(51) Int. Cl.
| | |
|---|---|
| *H01L 23/528* | (2006.01) |
| *H01L 23/48* | (2006.01) |
| *H10D 30/43* | (2025.01) |
| *H10D 30/62* | (2025.01) |
| *H10D 30/67* | (2025.01) |
(Continued)

(52) U.S. Cl.
CPC ........ *H01L 23/5286* (2013.01); *H01L 23/481*
(2013.01); *H10D 30/43* (2025.01); *H10D
30/6219* (2025.01); *H10D 30/6729* (2025.01);
*H10D 30/6735* (2025.01);
(Continued)

(58) Field of Classification Search
CPC .............. H01L 23/5286; H01L 23/481; H01L
21/76895; H10D 30/43; H10D 30/6219;
H10D 30/6729; H10D 30/6735; H10D
62/121; H10D 84/853; H10D 84/859;
H10D 30/014; H10D 64/256; H10D
84/0186; H10D 84/0193; H10D 84/038;
H10D 84/85; B82Y 10/00
See application file for complete search history.

(56) References Cited

U.S. PATENT DOCUMENTS

| | | |
|---|---|---|
| 8,106,478 B2 | 1/2012 | Hashimoto et al. |
| 8,357,955 B2 | 1/2013 | Tanaka |
(Continued)

FOREIGN PATENT DOCUMENTS

| | | |
|---|---|---|
| WO | 2013018589 A1 | 2/2013 |

*Primary Examiner* — William B Partridge
*Assistant Examiner* — Erik A. Anderson
(74) *Attorney, Agent, or Firm* — Wolf, Greenfield &
Sacks, P.C.

(57) ABSTRACT

According to some embodiments of the present disclosure,
a semiconductor device includes a first power rail configured
to provide a first voltage and extending in a first direction,
a substrate comprising a first well having a first conductivity
type and a second well having a second conductivity type,
a first well tap having the first conductivity type, on the first
well; a first source/drain region having the second conduc-
tivity type, on the first well; a first source/drain contact
extending in a second direction and electrically connected to
the first power rail, on the first source/drain region, a first
connection wiring electrically connected to the first source/
drain contact and extending in the first direction, and a first
well contact electrically connected to the first connection
wiring, on the first well tap.

9 Claims, 25 Drawing Sheets

TC

(51) Int. Cl.
H10D 62/10 (2025.01)
H10D 84/85 (2025.01)

(52) U.S. Cl.
CPC ......... H10D 62/121 (2025.01); H10D 84/853 (2025.01); H10D 84/859 (2025.01)

(56) References Cited

U.S. PATENT DOCUMENTS

| | | | |
|---|---|---|---|
| 9,082,886 B2 | 7/2015 | Chen et al. | |
| 9,406,815 B2 | 8/2016 | Chen et al. | |
| 10,157,910 B2 | 12/2018 | Xu et al. | |
| 11,296,230 B2 | 4/2022 | Iwahori | |
| 2005/0051801 A1* | 3/2005 | Shaw | H10D 84/907 |
| | | | 257/202 |
| 2008/0169868 A1* | 7/2008 | Toubou | H10D 84/85 |
| | | | 327/541 |
| 2009/0026546 A1 | 1/2009 | Shimada et al. | |
| 2011/0227133 A1 | 9/2011 | Morimoto | |
| 2018/0137231 A1* | 5/2018 | Sakuda | H10D 89/10 |
| 2022/0059572 A1 | 2/2022 | Ryu et al. | |

* cited by examiner

PR1(VDD)     PP     VA21     WC2     NN     VA11     WC1

PR1(VDD)

NW

TC →

PW

PR2(VSS)

PW

TC →

NW

PR1(VDD)

NW

TC →

PW

PR2(VSS)

CB

Y
↑
└→ X

| | col1 | col2 | col3 | col4 | col5 | col6 | col7 | col8 | col9 |
|---|---|---|---|---|---|---|---|---|---|
| VSS | | | | | | | | | |
| VDD | | | A | C | D | C | A | | |
| VSS | | | B | | TC | | B | | |
| VDD | | | G | | TC | | G | | |
| VSS | | | | | TC | | | | |
| VDD | A | C | H | | TC | | H | C | A |
| VSS | B | | TC | | TC | | TC | | B |
| VDD | B | | TC | | TC | | TC | | B |
| VSS | A | C | D | C | D | C | D | C | A |

Y
X

<u>H</u>

| | | | | A | C | D | C | A | | | |
|---|---|---|---|---|---|---|---|---|---|---|---|
VSS
VDD
VSS
VDD
VSS
VDD
VSS
VDD
VSS

SEMICONDUCTOR DEVICE

This application claims the benefit of Korean Patent Application No. 10-2022-0047381, filed on Apr. 18, 2022, and No. 10-2022-0097152, field on Aug. 4, 2022, in the Korean Intellectual Property Office, the disclosure of which is incorporated herein in its entirety by reference.

BACKGROUND

The present disclosure relates to a semiconductor device.

Due to characteristics such as miniaturization, multifunctionality, and/or low manufacturing cost, semiconductor devices are in the spotlight as an important element in the electronic industry. Semiconductor devices may be classified into a semiconductor memory device for storing logic data, a semiconductor logic device for processing logic data, and a hybrid semiconductor device including a storage element and a logic element.

As the electronic industry becomes highly developed, there are increasing demands on the characteristics of semiconductor devices. For example, semiconductor devices are increasingly required to have high reliability, high speed, and/or multifunctionality. In order to have these required characteristics, structures in semiconductor devices are becoming increasingly complex and highly integrated.

SUMMARY

Aspects of the present disclosure provide a semiconductor device with improved product reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some embodiments of the present disclosure, a semiconductor device includes a first power rail configured to provide a first voltage and extending in a first direction, a substrate comprising a first well having a first conductivity type and a second well having a second conductivity type, a first well tap having the first conductivity type, on the first well, a first source/drain region having the second conductivity type, on the first well, a first source/drain contact extending in a second direction and electrically connected to the first power rail, on the first source/drain region, a first connection wiring electrically connected to the first source/drain contact and extending in the first direction, and a first well contact electrically connected to the first connection wiring, on the first well tap.

According to some embodiments of the present disclosure, a semiconductor device includes a first power rail and a second power rail extending along a first direction on a substrate, and a plurality of tap cells on the substrate along a tap cell track extending in a second direction different from the first direction, wherein each of the tap cells includes a first well tap and a second well tap; a first well contact on the first well tap extending in the second direction, and electrically connected to the first power rail, a (1-1)-th connection wiring extending in the first direction and electrically connected to the first well contact; and a (2-1)-th connection wiring extending in the second direction and electrically connected to the (1-1)-th connection wiring and the first power rail.

According to some embodiments of the present disclosure, a semiconductor device includes a first power rail and a second power rail on a substrate and extending along a first direction, and a plurality of tap cells on the substrate and each including a first well tap configured to receive a first voltage from the first power rail through a first well contact and a second well tap configured to receive a second voltage from the second power rail through a second well contact, wherein the tap cells are on a tap cell track that extends along a second direction different from the first direction and are successively along the tap cell track or alternately disposed with dummy cells.

BRIEF DESCRIPTION OF THE DRAWINGS

These and/or other aspects will become apparent and more readily appreciated from the following description of the embodiments, taken in conjunction with the accompanying drawings in which:

FIGS. 5 through 8 are schematic layout views of tap cells according to some embodiments;

DETAILED DESCRIPTION

Figure 1:
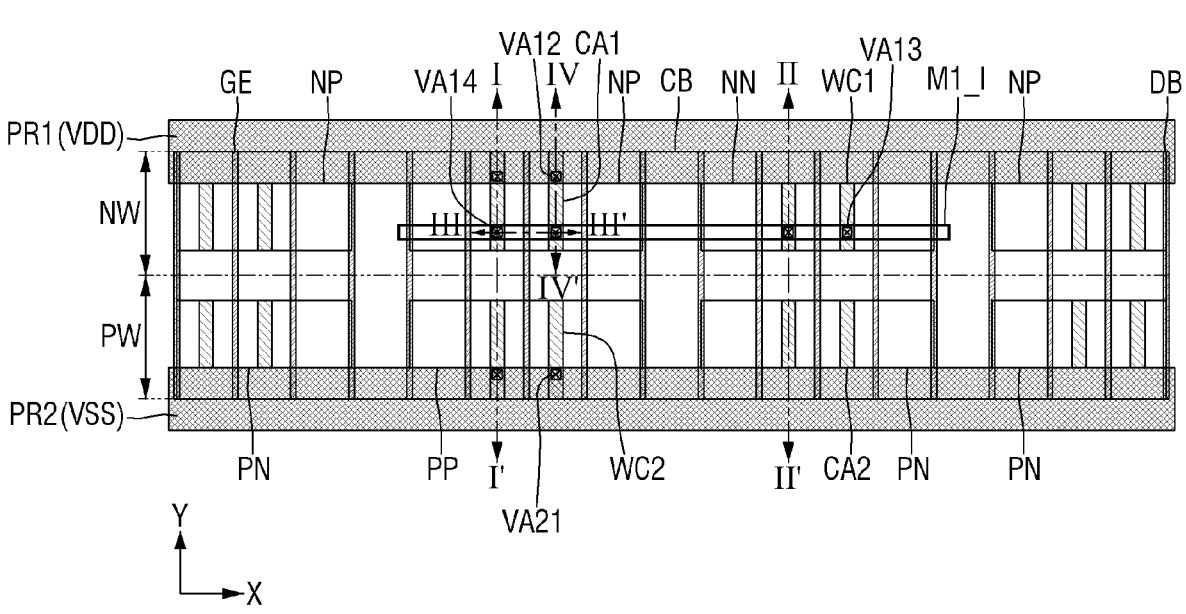
FIG. 1 is a schematic layout view of a tap cell according to some embodiments.
Figure 2:
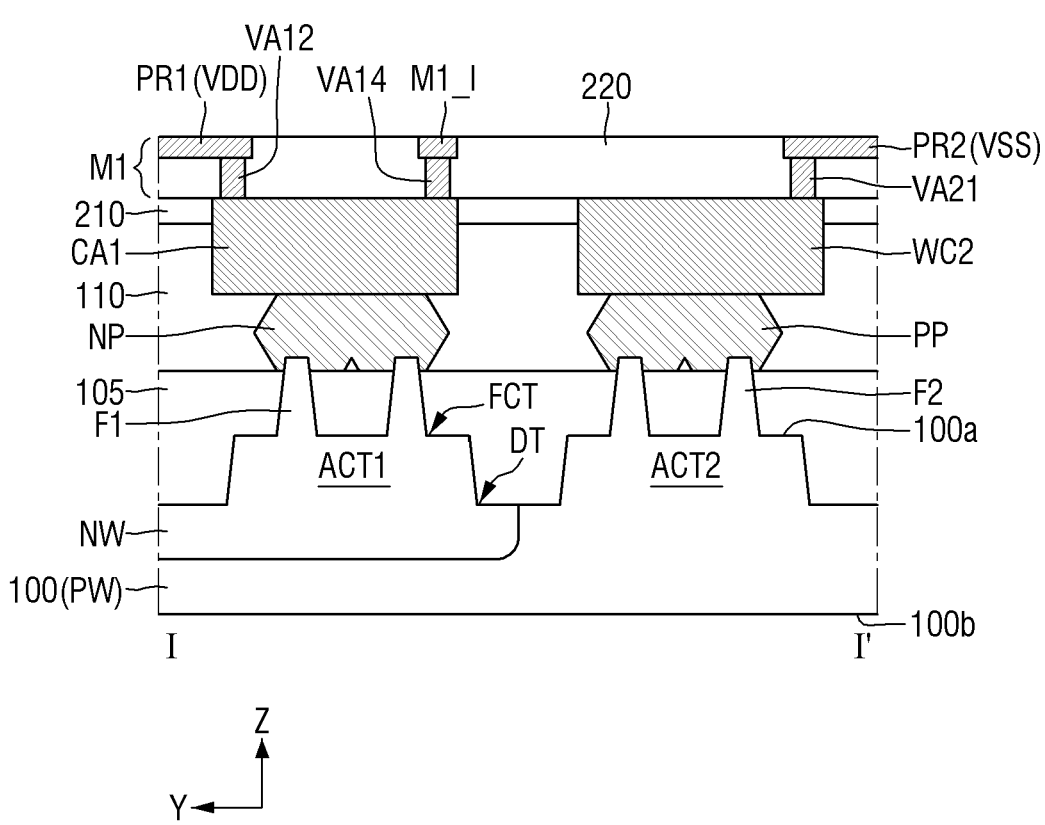
FIG. 2 is a cross-sectional view taken along line I-I' of FIG. 1.
Figure 3:
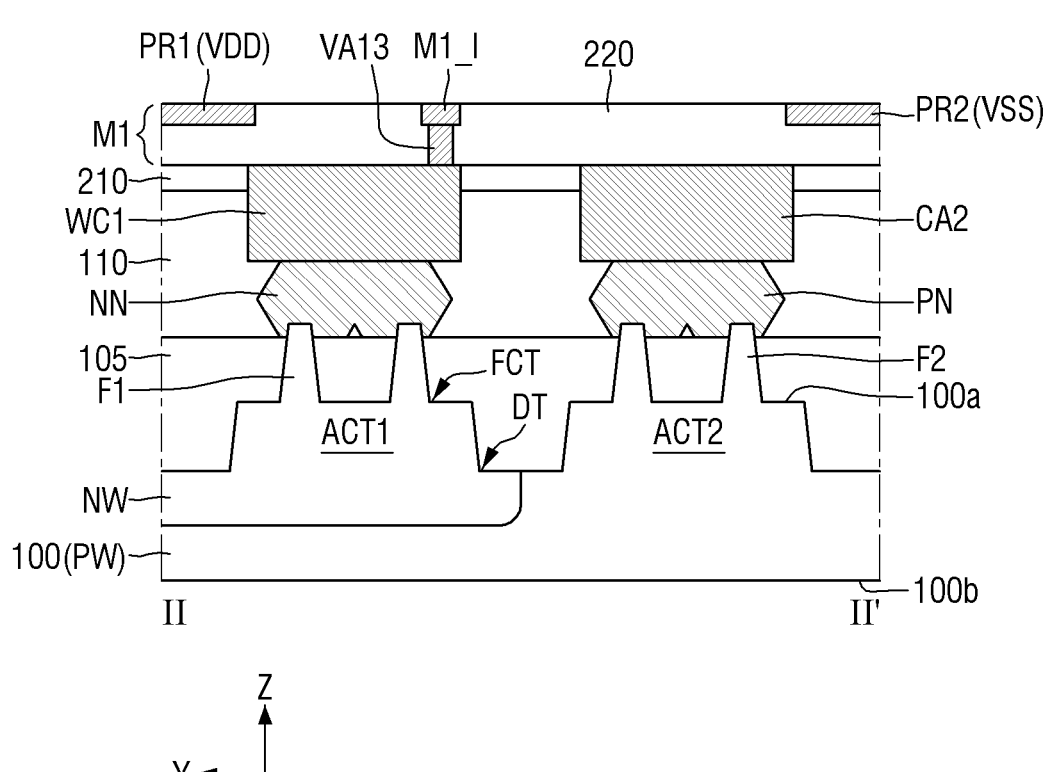
FIG. 3 is a cross-sectional view taken along line II-IF of FIG. 1.
Figure 4:
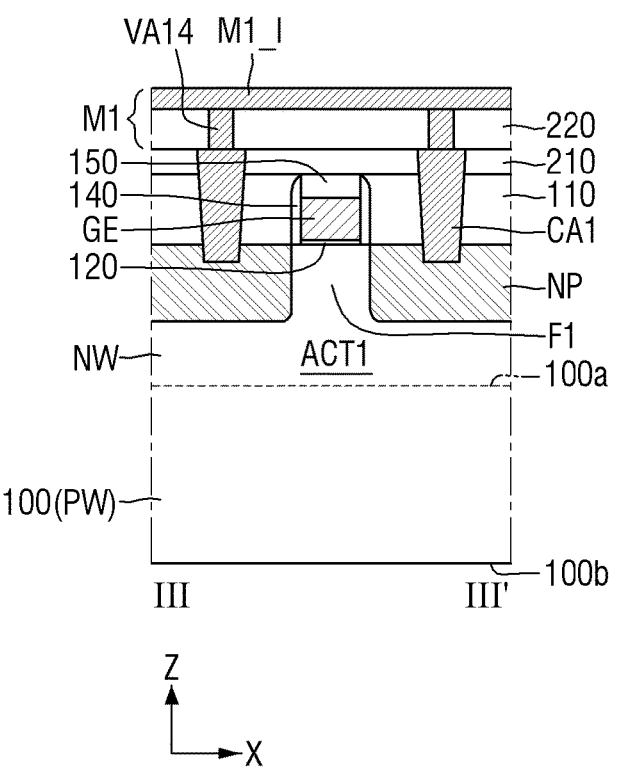
FIG. 4 is a cross-sectional view taken along line of FIG. 1.

FIG. 1 is a schematic layout view of a tap cell TC according to some embodiments. FIG. 2 is a cross-sectional view taken along line I-I' of FIG. 1. FIG. 3 is a cross-sectional view taken along line II-IF of FIG. 1. FIG. 4 is a cross-sectional view taken along line of FIG. 1.

Referring to FIGS. 1 through 3, the tap cell TC according to the embodiments may include first and second well taps NN and PP, first and second well contacts WC1 and WC2, first and second source/drain contacts CA1 and CA2, contact vias VA12, VA13, VA14 and VA21, and a first connection wiring M1_I.

A first power rail PR1 and a second power rail PR2 may extend in a first direction X on a substrate 100 and may be spaced apart from each other in a second direction Y. The tap cell TC may be disposed between the first power rail PR1 and the second power rail PR2. A boundary CB of the tap cell TC may overlap the first power rail PR1 and the second power rail PR2. In some embodiments, the tap cell TC may be a single height cell. A height of the single height cell in the second direction Y may be substantially the same as a pitch between the first power rail PR1 and the second power rail PR2.

The first power rail PR1 may provide a first voltage VDD, and the second power rail PR2 may provide a second voltage VSS different from the first voltage VDD. For example, the first voltage VDD may be a positive (+) voltage, and the second voltage VSS may be a ground (GND) voltage or a negative (−) voltage.

Separation structures DB may extend in the second direction Y. The tap cell TC may be defined by outermost separation structures DB. The boundary CB of the tap cell TC may overlap the separation structures DB. At least one separation structure DB may be further disposed inside the tap cell TC other than at the boundary CB of the tap cell TC, but the present disclosure is not limited thereto.

The substrate 100 may be bulk silicon or silicon-on-insulator (SOI). According to some embodiments, the substrate 100 may be a silicon substrate or may include another material such as, but not limited to, silicon germanium, silicon germanium on insulator (SGOI), indium antimonide, lead telluride, indium arsenide, indium phosphide, gallium arsenide, or gallium antimonide. For example, the substrate 100 may be doped with a P-type impurity.

The substrate 100 may include a first surface 100a and a second surface 100b opposite each other. The first surface 100a may also be referred to as an upper surface of the substrate 100, and the second surface 100b may also be referred to as a lower surface of the substrate 100. The tap cell TC may be implemented on the first surface 100a of the substrate 100.

The substrate 100 may include a first well NW having a first conductivity type and a second well PW having a second conductivity type. The first well NW and the second well PW may extend in the first direction X. The first well NW and the second well PW may be spaced apart from each other in the second direction Y. The first well NW may be a region doped with an N-type impurity on the substrate 100, and the second well PW may be the substrate 100 doped with a P-type impurity. However, the present disclosure is not limited thereto, and the second well PW may also be a region doped with a P-type impurity on the substrate 100. The first conductivity type will be described below as an N type, and the second conductivity type will be described as a P type.

The first well NW may include a first active region ACT1, and the second well PW may include a second active region ACT2. The first active region ACT1 and the second active region ACT2 may be defined by a substrate trench DT. The substrate trench DT may extend in the first direction X to separate the first active region ACT1 and the second active region ACT2.

First and second active patterns F1 and F2 may be formed on the substrate 100. For example, the first active patterns F1 may be formed on the first active region ACT1, and the second active patterns F2 may be formed on the second active region ACT2. The first and second active patterns F1 and F2 may extend in the first direction X. The first and second active patterns F1 and F2 may be spaced apart from each other in the second direction Y intersecting the first direction X. Each of the first and second active patterns F1 and F2 may be a portion of the substrate 100 or may include an epitaxial layer grown from the substrate 100.

The first and second active patterns F1 and F2 may be defined by a fin cut trench FCT. The fin cut trench FCT may define sidewalls of the first and second active patterns F1 and F2. The substrate trench DT may be a trench deeper than the fin cut trench FCT.

In some embodiments, each of the first and second active patterns F1 and F2 may include a fin pattern protruding from the first surface 100a of the substrate 100. In plan view, each of the first and second active patterns F1 and F2 may be shaped like a bar extending in the first direction X.

A device isolation layer 105 may be formed on the first surface 100a of the substrate 100. The device isolation layer 105 may at least partially surround the sidewalls of the first active patterns F1 and the sidewalls of the second active patterns F2. The device isolation layer 105 may at least partially fill the substrate trench DT and the fin cut trench FCT. The first and second active patterns F1 and F2 may protrude above an upper surface of the device isolation layer 105.

The device isolation layer 105 may include, for example, an oxide layer, a nitride layer, an oxynitride layer, or a combination thereof.

Gate electrodes GE may cross the first and second active patterns F1 and F2. The gate electrodes GE may extend in the second direction Y and may be arranged at intervals of one contacted poly pitch (CPP) along the first direction X. A distance between a separation structure DB and a gate electrode GE neighboring each other, a distance between the gate electrodes GE neighboring each other, and a distance between the separation structures DB neighboring each other may be one CPP.

The gate electrodes GE may include, but are not limited to, at least one of Ti, Ta, W, Al, Co, and/or combinations thereof. The gate electrodes GE may also include, for example, silicon or silicon germanium rather than a metal.

Although each of the gate electrodes GE is illustrated as a single layer in the drawings, the technical spirit of the present disclosure is not limited thereto. Unlike in the drawings, each of the gate electrodes GE may also be formed by stacking a plurality of conductive materials. For example, each of the gate electrodes GE may include a work function control layer for controlling a work function and a filling conductive layer filling a space formed by the work function control layer. The work function control layer may include, for example, at least one of TiN, TaN, TiC, TaC, TiAlC, and/or combinations thereof. The filling conductive layer may include, for example, W or Al. The gate electrodes GE may be formed through, for example, a replacement process, but the present disclosure is not limited thereto.

A gate dielectric layer 120 may be interposed between the first and second active patterns F1 and F2 and the gate electrodes GE. For example, the gate dielectric layer 120 may extend along sidewalls of the gate electrodes GE. However, the present disclosure is not limited thereto, and the gate dielectric layer 120 may also extend along the sidewalls and bottom surfaces of the gate electrodes GE.

The gate dielectric layer 120 may be interposed between the device isolation layer 105 and the gate electrodes GE. The gate dielectric layer 120 may be formed along the profiles of the first and second active patterns F1 and F2 protruding above the device isolation layer 105 and along the upper surface of the device isolation layer 105.

The gate dielectric layer 120 may include, for example, at least one of silicon oxide, silicon oxynitride, silicon nitride, and/or a high-k material having a greater dielectric constant than silicon oxide. The high-k material may include, but is not limited to, hafnium oxide.

Gate spacers 140 may be formed on the substrate 100 and the device isolation layer 105. The gate spacers 140 may extend along both sidewalls of each of the gate electrodes GE. The gate spacers 140 may be disposed on long sidewalls of each of the gate electrodes GE. For example, the gate spacers 140 may extend in the second direction Y.

The gate spacers 140 may include, but is not limited to, at least one of silicon oxide, silicon nitride, silicon oxynitride, and/or combinations thereof.

A gate capping pattern 150 may extend along an upper surface of each of the gate electrodes GE. For example, the gate capping pattern 150 may extend in the second direction Y to cover the upper surface of each of the gate electrodes GE. However, the present disclosure is not limited thereto, and the gate capping pattern 150 may also be further disposed on upper surfaces of the gate spacers 140.

The gate capping pattern 150 may include, but is not limited to, at least one of silicon oxide, silicon nitride, silicon oxynitride, and/or combinations thereof.

A first source/drain region NP may be disposed on the first active patterns F1 of the first well NW. The first source/drain region NP may be formed in the first active patterns F1 on both sides of each of the gate electrodes GE. The first source/drain region NP may be spaced apart from each of the gate electrodes GE by the gate spacers 140. The first source/drain region NP may include an epitaxial layer formed in each first active pattern F1. In some embodiments, the first active patterns F1 may share the first source/drain region NP. For example, the first source/drain region NP may be a merged epitaxial layer.

A second source/drain region PN may be disposed on the second active patterns F2 of the second well PW. The second source/drain region PN may be formed in the second active patterns F2 on both sides of each of the gate electrodes GE. The second source/drain region PN may be spaced apart from each of the gate electrodes GE by the gate spacers 140. The second source/drain region PN may include an epitaxial layer formed in each second active pattern F2. In some embodiments, the second active patterns F2 may share the second source/drain region PN. For example, the second source/drain region PN may be a merged epitaxial layer.

Although each of the first source/drain region NP and the second source/drain region PN is illustrated as a single layer, the present disclosure is not limited thereto. For example, each of the first source/drain region NP and the second source/drain region PN may also be formed as a multilayer including impurities having different concentrations.

The first source/drain region NP may be a P-type impurity region, and the second source/drain region PN may be an N-type impurity region.

First through third upper interlayer insulating layers 110, 210 and 220 may be sequentially stacked on the first surface 100a of the substrate 100. The first through third upper interlayer insulating layers 110, 210 and 220 may include, but are not limited to, at least one of silicon oxide, silicon oxynitride, and/or a low-k material having a lower dielectric constant than silicon oxide.

The first upper interlayer insulating layer 110 and the second upper interlayer insulating layer 210 may be formed to cover the device isolation layer 105, the first and second source/drain regions NP and PN, the first and second well taps NN and PP, the gate spacers 140, and the gate capping pattern 150. For example, the first upper interlayer insulating layer 110 may be formed on the device isolation layer 105 to cover or overlap sidewalls of the gate spacers 140. The second upper interlayer insulating layer 210 may be formed on the first upper interlayer insulating layer 110 to cover or overlap an upper surface of the gate capping pattern 150.

The first source/drain contacts CA1 may be disposed on the first source/drain region NP. The first source/drain contacts CA1 may penetrate the first upper interlayer insulating layer 110 and the second upper interlayer insulating layer 210 and may be connected to the first source/drain region NP. The second source/drain contacts CA2 may be disposed on the second source/drain region PN. The second source/drain contacts CA2 may be connected to the second source/drain region PN.

The first well tap NN may be disposed on the first active patterns F1 of the first well NW. The second well tap PP may be disposed on the second active patterns F2 of the second well PW. The first well tap NN may be an N-type impurity region, and the second well tap PP may be a P-type impurity region. The first well tap NN and the second well tap PP may be shaped similarly to the first source/drain region NP and the second source/drain region PN, respectively.

In some embodiments, the first well tap NN may neighbor the first source/drain region NP in the first direction X and may neighbor the second source/drain region PN in the second direction Y. The second well tap PP may neighbor the second source/drain region PN in the first direction X and may neighbor the first source/drain region NP in the second direction Y.

The first well contacts WC1 may be disposed on the first well tap NN. The first well contacts WC1 may penetrate the first upper interlayer insulating layer 110 and the second upper interlayer insulating layer 210 and may be connected to the first well tap NN. The second well contacts WC2 may be disposed on the second well tap PP. The second well contacts WC2 may penetrate the first upper interlayer insulating layer 110 and the second upper interlayer insulating layer 210 and may be connected to the second well tap PP. The first well contacts WC1 and the second well contacts WC2 may be shaped similarly to the first source/drain contacts CA1 and the second source/drain contacts CA2, respectively.

Each of the first and second source/drain contacts CA1 and CA2 and the first and second well contacts WC1 and WC2 may include, but is not limited to, at least one of aluminum (Al), copper (Cu), tungsten (W), molybdenum (Mo), and/or cobalt (Co). In some embodiments, each of the first and second source/drain contacts CA1 and CA2 and the first and second well contacts WC1 and WC2 may include tungsten.

A first metal layer M1 may be disposed in the third upper interlayer insulating layer 220. The first metal layer M1 may include the first power rail PR1, the second power rail PR2, and the first connection wiring M1_I. That is, the first connection wiring M1_I may be disposed at the same metal level as the first power rail PR1 and the second power rail PR2. The first connection wiring M1_I may be disposed between the first power rail PR1 and the second power rail PR2. The first connection wiring M1_I may extend in the first direction X on the first well NW.

The wirings M1_I, PR1 and PR2 of the first metal layer M1 may include at least one metal material selected from aluminum, copper, tungsten, molybdenum, and/or cobalt. In addition, a plurality of metal layers (e.g., M2, M3, M4, etc.) may be additionally stacked on the third upper interlayer insulating layer 220. The metal layers may include wirings for routing.

The first well tap NN may receive the first voltage VDD from the first power rail PR1 through the first well contacts WC1. In some embodiments, the first well contacts WC1 may receive the first voltage VDD from the first source/drain contacts CA1.

Specifically, the first source/drain contacts CA1 may extend in the second direction Y to overlap the first power rail PR1 in a third direction Z. The first source/drain contacts CA1 may be connected to the first power rail PR1 through the contact vias VA12. The first connection wiring M1_I may extend in the first direction X to overlap the first source/drain contacts CA1 in the third direction Z. The first source/drain contacts CA1 may be connected to the first connection wiring M1_I through the contact vias VA14. The first connection wiring M1_I may extend in the first direction X to overlap the first source/drain contacts CA1 and the first well contacts WC1 in the third direction Z. That is, the first connection wiring M1_I may extend in the first direction X to connect the first source/drain contacts CA1, which are connected to the first power rail PR1, and the first well contacts WC1.

The first well contacts WC1 extend in the second direction Y but do not overlap the first power rail PR1 in the third direction Z. That is, contact vias are not disposed between the first well contacts WC1 and the first power rail PR1. The first well contacts WC1 may extend in the second direction Y to overlap the first connection wiring M1_I in the third direction Z. The first well contacts WC1 may be connected to the first connection wiring M1_I through the contact vias VA13. A length by which the first connection wiring M1_I extends in the first direction X can vary as long as the first connection wiring M1_1 overlaps the first source/drain contacts CA1, which are connected to the first power rail PR1, and the first well contacts WC1 in the third direction Z.

That is, the first well tap NN may receive the first voltage VDD through the first power rail PR1, the contact vias VA12, the first source/drain contacts CA1, the contact vias VA14, the first connection wiring M1_I, the contact vias VA13, and the first well contacts WC1.

The first well contacts WC1 may receive the first voltage VDD from the first source/drain contacts CA1 disposed in a dummy region within the tap cell TC. The first well contacts WC1 may receive the first voltage VDD from, for example, adjacent first source/drain contacts CA1. The first well contacts WC1 may receive the first voltage VDD from the first source/drain contacts CA1 adjacent to the right or left of the first well contacts WC1 through the first connection wiring M1_I. According to some embodiments, the first well contacts WC1 may receive the first voltage VDD from the first source/drain contacts CA1 spaced apart from the first well contacts WC1. The first well contacts WC1 may receive the first voltage VDD from, for example, the first source/drain contacts CA1 adjacent to the boundary CB of the tap cell TC through the first connection wiring M1_I.

The second well tap PP may receive the second voltage VSS from the second power rail PR2 through the second well contacts WC2. The second well contacts WC2 may extend in the second direction Y to overlap the second power rail PR2 in the third direction Z. The second well contacts WC2 may be connected to the second power rail PR2 through the contact vias VA21.

In general, cells are arranged in each row, and neighboring cells arranged in neighboring rows may share the wells NW and PW and the well taps NN and PP. The cells may be connected to the power rails PR1 and PR2 through source/drain contacts, and neighboring cells may share the source/drain contacts.

When the tap cell TC and a logic cell neighbor each other, source/drain regions of the logic cell may share the well taps NN and PN of the tap cell TC. The logic cell may share the well contacts WC1 and WC2 of the tap cell TC. That is, the well contacts WC1 and WC2 may extend onto the logic cell, and the logic cell may use the well contacts WC1 and WC2 as source/drain contacts. In this case, since conductivity types of the well taps NN and PP of the tap cell TC are different from conductivity types of the source/drain regions of the logic cell, defects may occur in the well contacts WC1 and WC2.

For example, the first well NW of the tap cell TC may neighbor an N-type well of the logic cell, and the logic cell may share the first well contacts WC1 of the tap cell TC. The first well contacts WC1 may be connected to the first well tap NN which is an N-type impurity region and may be connected to a source/drain region of the logic cell, which is a P-type impurity region. Therefore, the first well contacts WC1 may be corroded, and there may be a problem with the operation of the logic cell. In particular, the first well contacts WC1 may be corroded.

However, the first well contacts WC1 of the tap cell TC according to some embodiments do not overlap the first power rail PR1 in the third direction Z. That is, the first well contacts WC1 may be cut on the first power rail PR1, and the logic cell does not share the first well contacts WC1. Accordingly, it is possible to reduce or prevent defects or corrosion of the first well contacts WC1. In addition, it is possible to prevent a problem in the operation of the logic cell due to the use of the first well contacts WC1 as source/drain contacts.

FIGS. 5 through 8 are schematic layout views of tap cells TC according to some embodiments. For ease of description, differences from elements and features described with reference to FIGS. 1 through 4 will be mainly described below.

Figure 5:
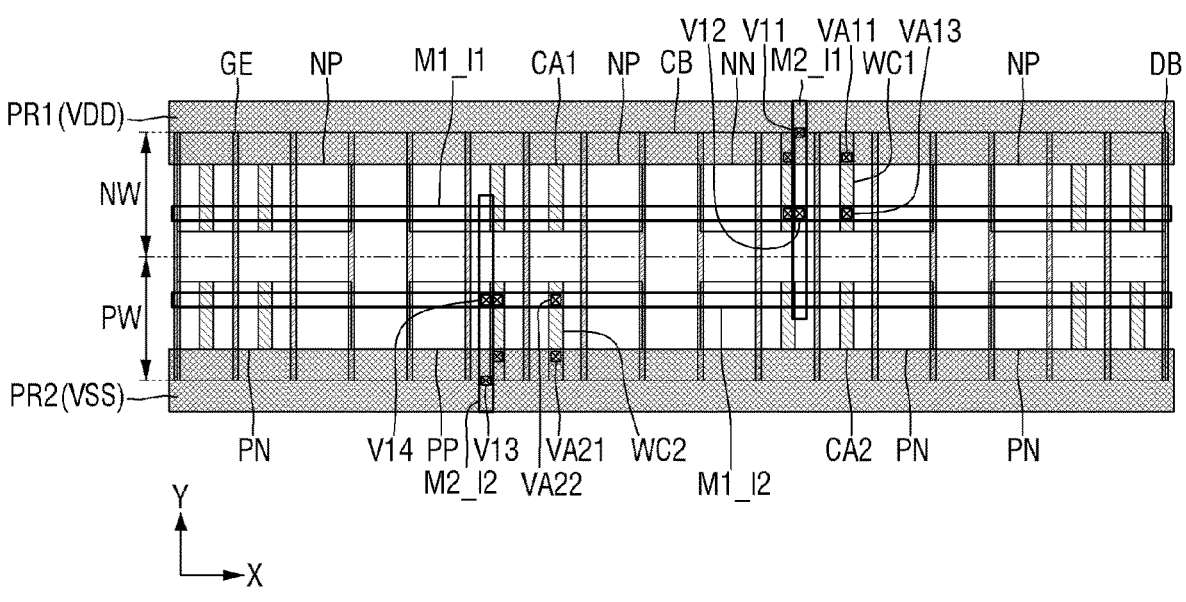

Referring to FIG. 5, a tap cell TC according to some embodiments may include first and second well taps NN and PP, first and second well contacts WC1 and WC2, first and second source/drain contacts CA1 and CA2, contact vias VA11, VA13, VA21 and VA22, first connection wirings M1_I1 and M1_I2, first vias V11, V12, V13 and V14, and second connection wirings M2_I1 and M2_I2.

The first connection wirings M1_I1 and M1_I2 may include a $(1\text{-}1)^{th}$ connection wiring M1_I1 extending in the first direction X on a first well NW and a $(1\text{-}2)^{th}$ connection wiring M1_I2 extending in the first direction X on a second well PW. A length by which the $(1\text{-}1)^{th}$ and $(1\text{-}2)^{th}$ connection wirings M1_I1 and M1_I2 extend in the first direction X can vary as long as the $(1\text{-}1)^{th}$ and $(1\text{-}2)^{th}$ connection wirings M1_I1 and M1_I2 overlap the first and second well contacts WC1 and WC2, respectively.

A second metal layer may be disposed on a first metal layer M1 (see FIGS. 2 through 4). The second metal layer may be disposed in a fourth upper interlayer insulating layer disposed on a third upper interlayer insulating layer 220 (see FIGS. 2 through 4). The second metal layer may be a higher metal level than the first metal layer with respect to substrate 100. The second metal layer may be disposed on the first metal layer in the third direction Z. The second metal layer may include the second connection wirings M2_I1 and M2_I2. The second connection wirings M2_I1 and M2_I2 may include a $(2\text{-}1)^{th}$ connection wiring M2_I1 extending in the second direction Y on the first well tap NN and a $(2\text{-}2)^{th}$ connection wiring M2_I2 extending in the second direction Y on the second well tap PP. A length by which the $(2\text{-}1)^{th}$ and $(2\text{-}2)^{th}$ connection wirings M2_I1 and M2_I2 extend in the second direction Y can vary as long as the $(2\text{-}1)^{th}$ and $(2\text{-}2)^{th}$ connection wirings M2_I1 and M2_I2 overlap the first vias V11 and V12 and the first vias V13 and V14 in the third direction Z, respectively.

The first well tap NN may receive a first voltage VDD from a first power rail PR1 through the first well contacts WC1. The first well contacts WC1 may extend in the second direction Y to overlap the first power rail PR1 in the third direction Z. The first well contacts WC1 may be connected to the first power rail PR1 through the contact vias VA11.

The $(1\text{-}1)^{th}$ connection wiring M1_I1 may extend in the first direction X to overlap the first well contacts WC1 in the third direction Z. The first well contacts WC1 may be connected to the $(1\text{-}1)^{th}$ connection wiring M1_I1 through the contact vias VA13. The $(2\text{-}1)^{th}$ connection wiring M2_I1 may extend in the second direction Y to overlap the first power rail PR1 and the $(1\text{-}1)^{th}$ connection wiring M1_I1 in the third direction Z. The $(2\text{-}1)^{th}$ connection wiring M2_I1 may be connected to the first power rail PR1 through the first via V11 and may be connected to the $(1\text{-}1)^{th}$ connection wiring M1_I1 through the first via V12. The first well contacts WC1 may be connected to the first power rail PR1 through the contact vias VA13, the $(1\text{-}1)^{th}$ connection wiring M1_I1, the first via V12, the $(2\text{-}1)^{th}$ connection wiring M2_I1, and the first via V11.

That is, the first well contacts WC1 may be connected to the first power rail PR1 through the contact vias VA11 and the contact vias VA13.

The $(1\text{-}2)^{th}$ connection wiring M1_I2 may extend in the first direction X to overlap the second well contacts WC2 in the third direction Z. The second well contacts WC2 may be connected to the $(1\text{-}2)^{th}$ connection wiring M1_I2 through the contact vias VA22. The $(2\text{-}2)^{th}$ connection wiring M2_I2 may extend in the second direction Y to overlap a second power rail PR2 and the $(1\text{-}2)^{th}$ connection wiring M1_I2 in the third direction Z. The $(2\text{-}2)^{th}$ connection wiring M2_I2 may be connected to the second power rail PR2 through the first via V13 and may be connected to the $(1\text{-}2)^{th}$ connection wiring M1_I2 through the first via V14. The second well contacts WC2 may be connected to (the second power rail PR2 through the contact vias VA22, the $(1\text{-}2)^{th}$ connection wiring M1_I2, the first via V14, the $(2\text{-}2)^{th}$ connection wiring M2_I2, and the first via V13.

That is, the second well contacts WC2 may be connected to the second power rail PR2 through the contact vias VA21 and the contact vias VA22.

In the tap cell TC according to the embodiments, the number of the contact vias VA11, VA13, VA21 and VA22 connected to the first and second well contacts WC1 and WC2 may be increased to improve or enhance the provision of the first and second voltages VDD and VSS to the first and second well taps NN and PP, respectively.

Figure 6:
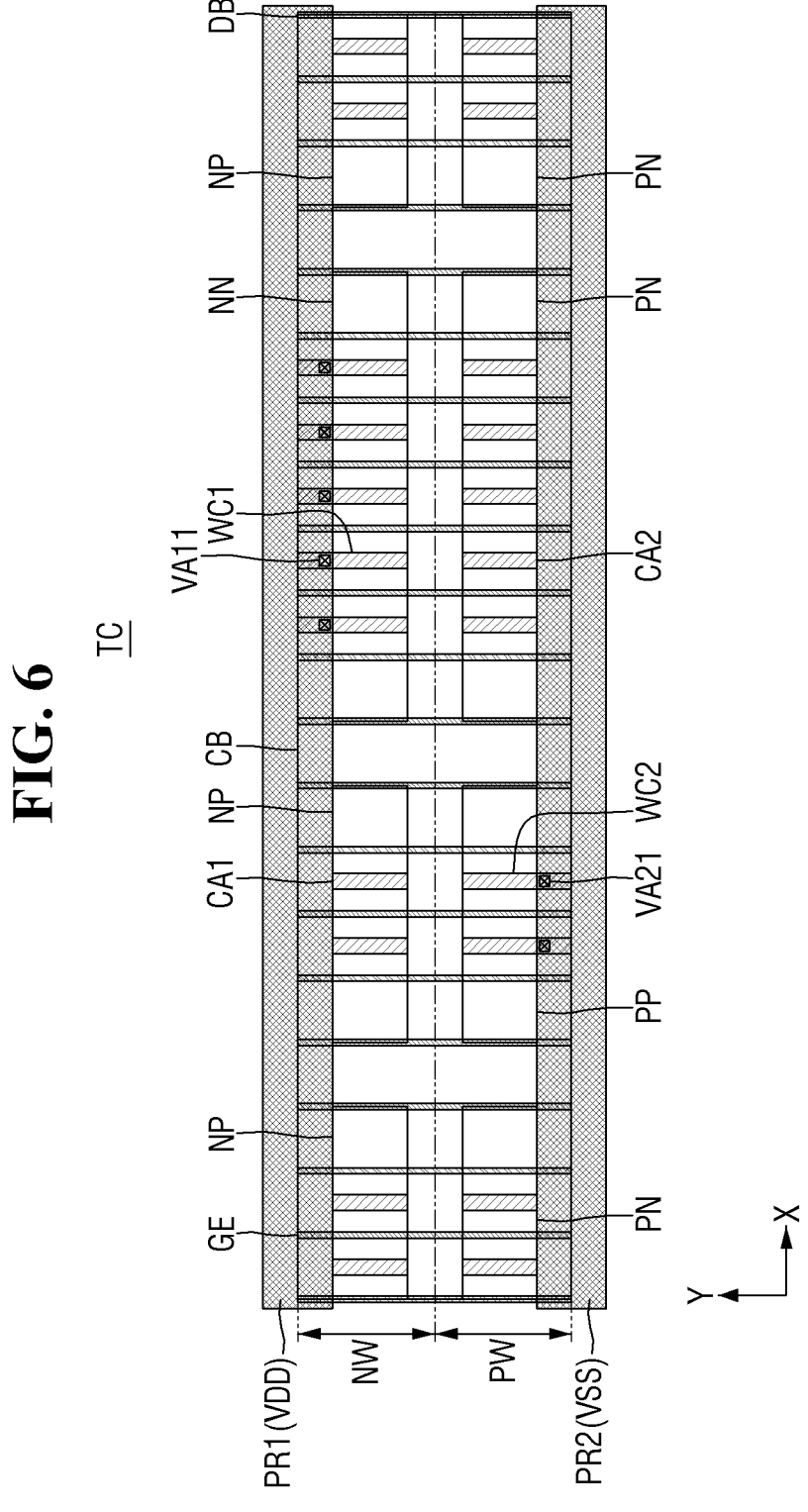

Referring to FIG. 6, in a tap cell TC according to some embodiments, a width of a first well tap NN in the first direction X may be different from a width of a second well tap PP in the first direction X. In the first direction X, the width of the first well tap NN may be greater than the width of the second well tap PP. For example, a width of the tap cell TC of FIG. 6 in the first direction X may be greater than a width of the tap cell TC of FIG. 1 in the first direction X. The width of the first well tap NN of FIG. 6 in the first direction X may be greater than the width of the first well tap NN of FIG. 1 in the first direction X.

In the tap cell TC according to the embodiments, the number of first well contacts WC1 may be different from the number of second well contacts WC2. The number of the first well contacts WC1 may be greater than the number of the second well contacts WC2. The number of contact vias VA11 connecting a first power rail PR1 and the first well contacts WC1 may be greater than the number of contact vias VA21 connecting a second power rail PR2 and the second well contacts WC2. Accordingly, the provision of a first voltage VDD to the first well tap NN can be improved or enhanced.

The contact vias VA11 and VA21 are similar to those described with reference to FIG. 5, and thus a detailed description thereof will be omitted.

Figure 7:
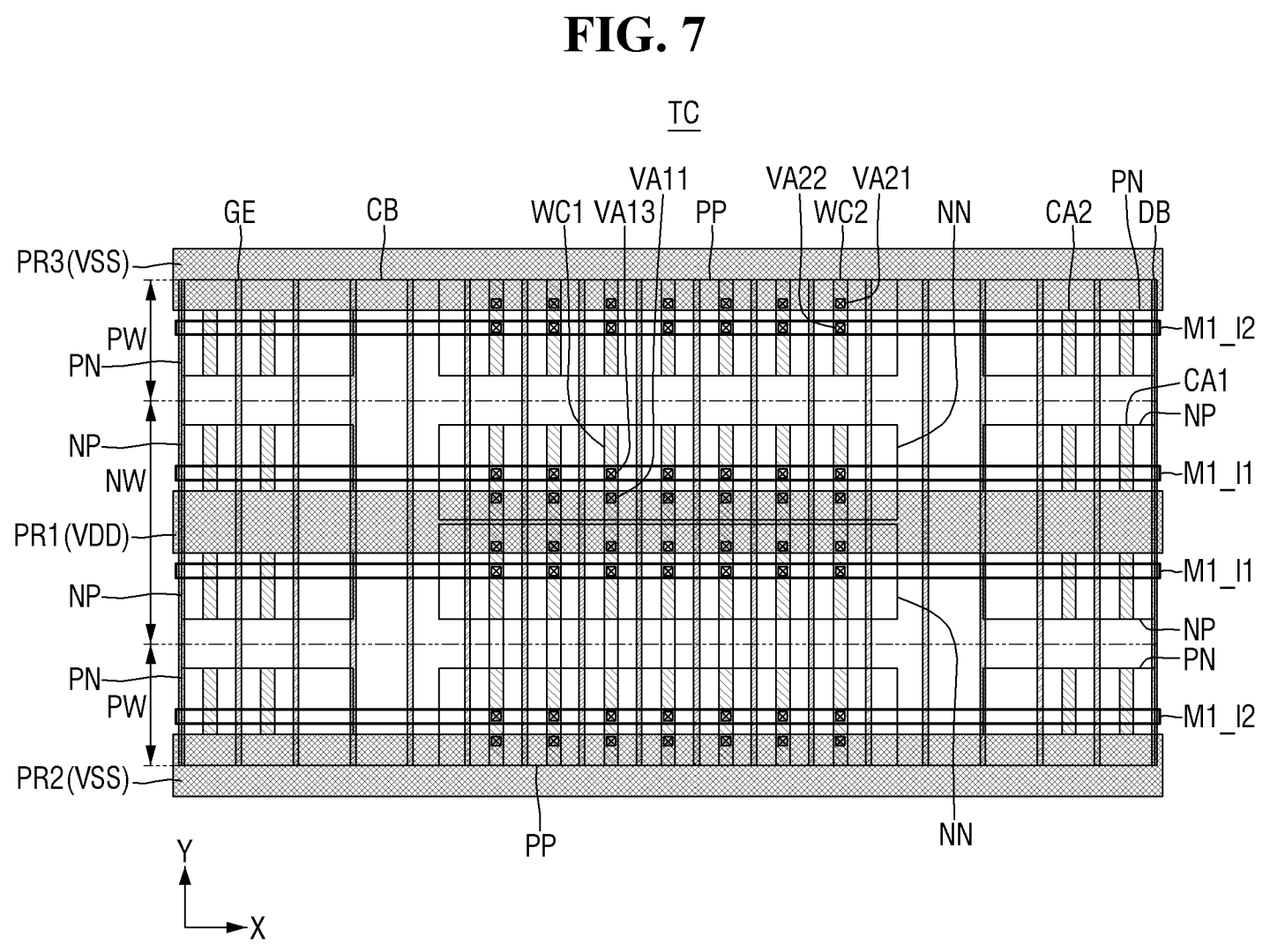
Figure 8:
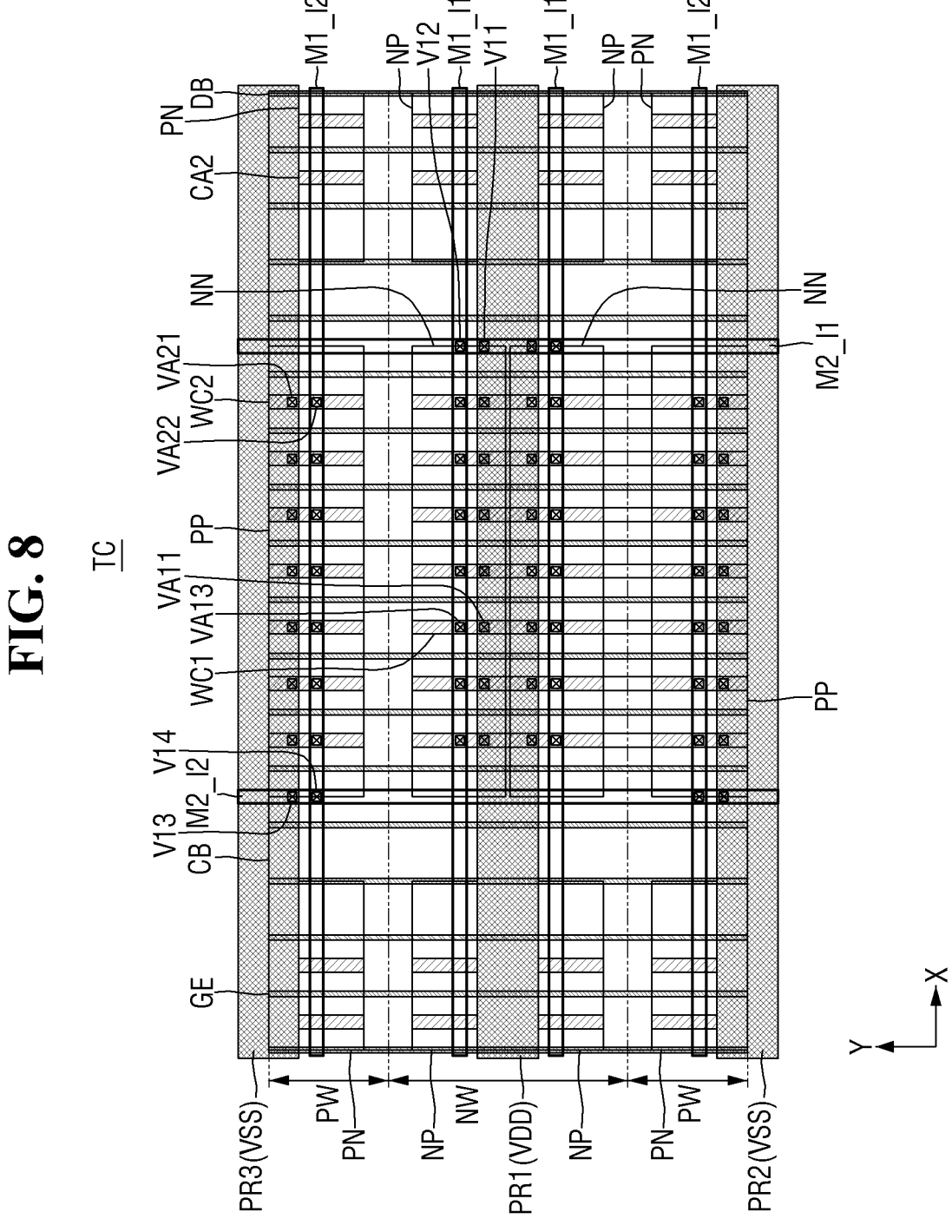

Referring to FIGS. 7 and 8, tap cells TC according to some embodiments may be double height cells. For example, a second power rail PR2, a first power rail PR1, and a third power rail PR3 may be sequentially disposed along the second direction Y on a substrate 100, and a tap cell TC may be disposed between the second and third power rails PR2 and PR3. A boundary CB of the tap cell TC may overlap the second and third power rails PR2 and PR3.

A height of the tap cell TC in the second direction Y may be about twice a height of each of the tap cells TC of FIGS. 1 through 6 in the second direction Y. A height of a first well tap NN in the second direction Y may be about twice a height of each of the first well taps NN of FIGS. 1 through 6 in the second direction Y. The increased height of the first well tap NN in the second direction Y may reduce the difficulty of a manufacturing process of the tap cell TC.

Each first well tap NN may neighbor a second well tap PP in the second direction Y, and each first source/drain region NP may neighbor a second source/drain region PN in the second direction Y. For example, each of the tap cells TC of FIGS. 7 and 8 may be the tap cell TC of FIG. 1 from which one contacted poly pitch (CPP) between a first source/drain region NP and the first well tap NN (or between the second well tap PP and a second source/drain region PN) has been removed.

Well taps NN or PP having the same conductivity type may be disposed above and below one power rail PR1, PR2 or PR3 in the second direction Y. The well taps NN or PP may share well contacts WC1 or WC2 with each other. For example, the second well taps PP may be disposed above and below the second power rail PR2 and may share second well contacts WC2 with each other. The second well contacts WC2 may extend in the second direction Y to overlap the second power rail PR2 and the second well taps PP above and below the second power rail PR2 in the third direction Z. For example, the second well contacts WC2 may be arranged on the second well taps PP at intervals of 1 CPP. However, the present disclosure is not limited thereto, and the first well taps NN neighboring each other may also share first well contacts WC1.

Contact vias VA11, VA13, VA21 and VA22 are similar to those described with reference to FIG. 5, and thus a detailed description thereof will be omitted.

Referring to FIG. 8, a tap cell TC according to some embodiments may further include first connection wirings M1_I1 and M1_I2 and second connection wirings M2_I1 and M2_I2. Each of $(2\text{-}1)^{th}$ and $(2\text{-}2)^{th}$ connection wirings M2_I1 and M2_I2 may extend in the second direction Y and may be connected to a plurality of $(1\text{-}1)^{th}$ or $(1\text{-}2)^{th}$ connection wirings M1_I1 or M1_I2.

For example, the $(2\text{-}1)^{th}$ connection wiring M2_I1 may extend in the second direction Y and may be connected to a $(1\text{-}1)^{th}$ connection wiring M1_I1 disposed above the first power rail PR1 and a $(1\text{-}1)^{th}$ connection wiring M1_I1 disposed below the first power rail PR1. The $(2\text{-}2)^{th}$ connection wiring M2_I2 may extend in the second direction Y and may be connected to $(1\text{-}2)^{th}$ connection wirings M1_I2 disposed above the second power rail PR2 and below the third power rail PR3.

Contact vias VA11, VA13, VA21 and VA22, first vias V11, V12, V13 and V14, the first connection wirings M1_I1 and M1_I2, and the second connection wirings M2_I1 and M2_I2 are similar to those described with reference to FIG. 5, and thus a detailed description thereof will be omitted.

Although the first and second well taps NN and PP have been described with reference to FIGS. 1 through 8 by using the tap cells TC as an example, they can also be applied to other cells including first and second well taps NN and PP.

For example, a switch cell may include first and second well taps NN and PP. For example, referring to FIG. 1, the first well tap NN of the switch cell may receive a first voltage VDD through a first connection wiring M1_I. The switch cell may refer to an element configured to generate a virtual voltage based on a voltage supplied from the outside. A standard cell may receive the virtual voltage from the switch cell.

Figure 9:
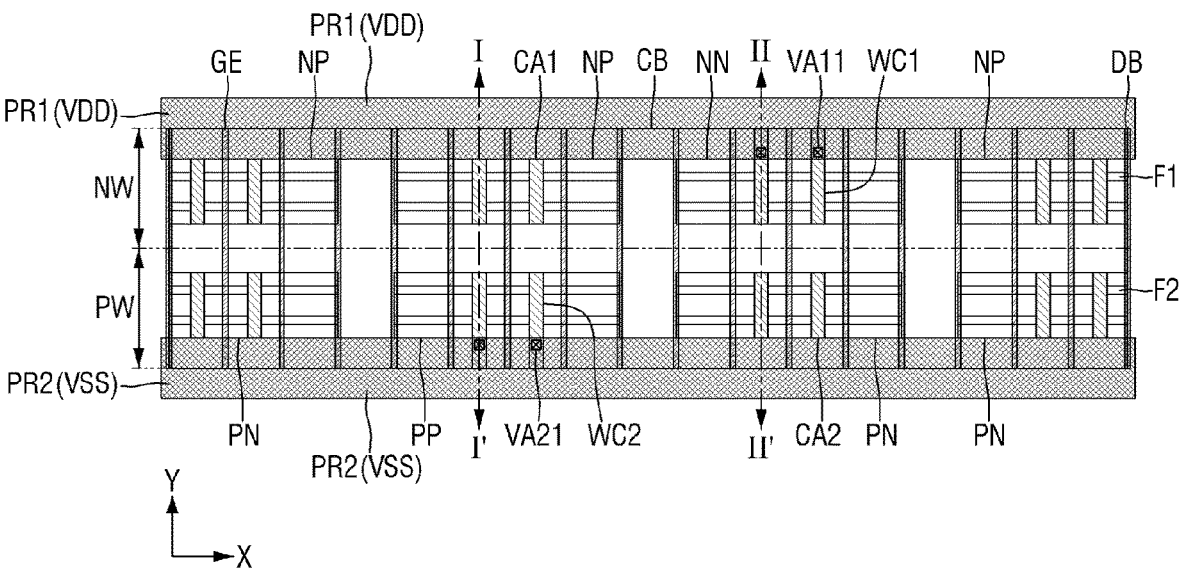
FIG. 9 is a schematic layout view of a tap cell according to some embodiments.
Figure 10:
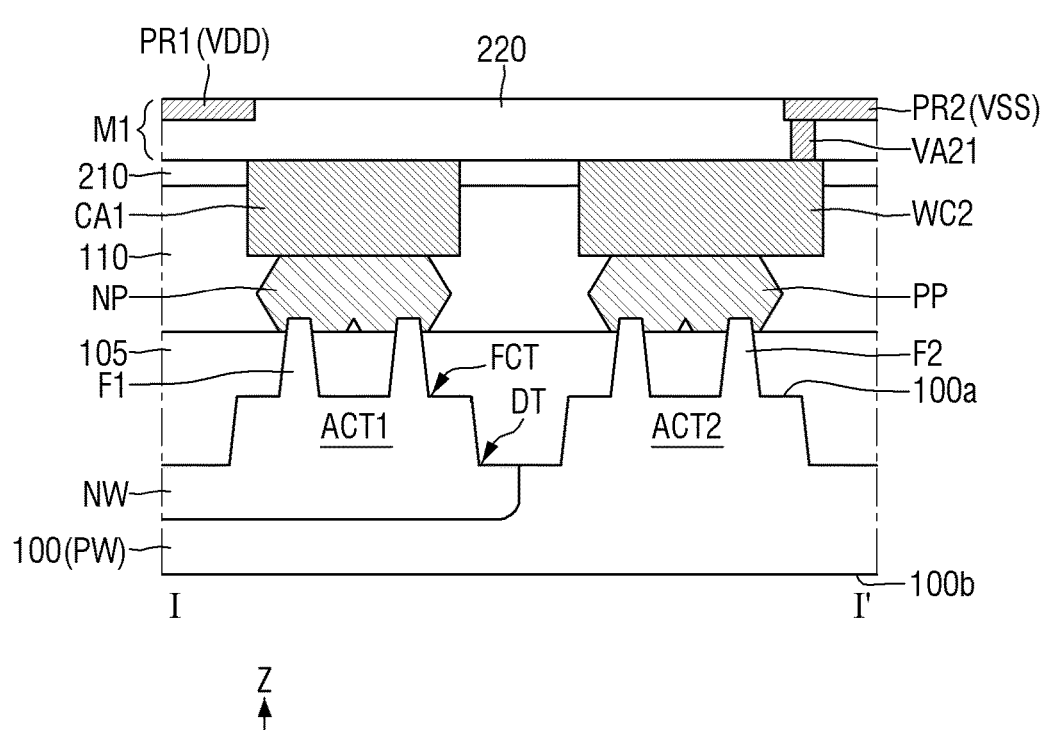
FIG. 10 is a cross-sectional view taken along line I-I' of FIG. 9.
Figure 10:
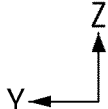
Figure 11:
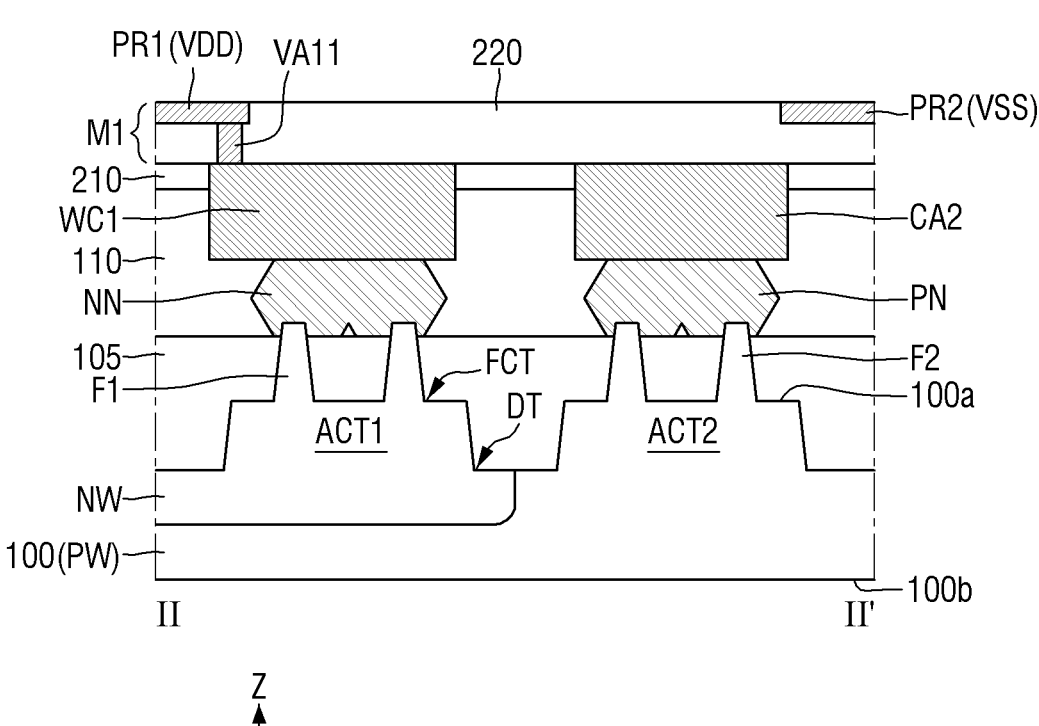
FIG. 11 is a cross-sectional view taken along line II-IF of FIG. 9.
Figure 12:
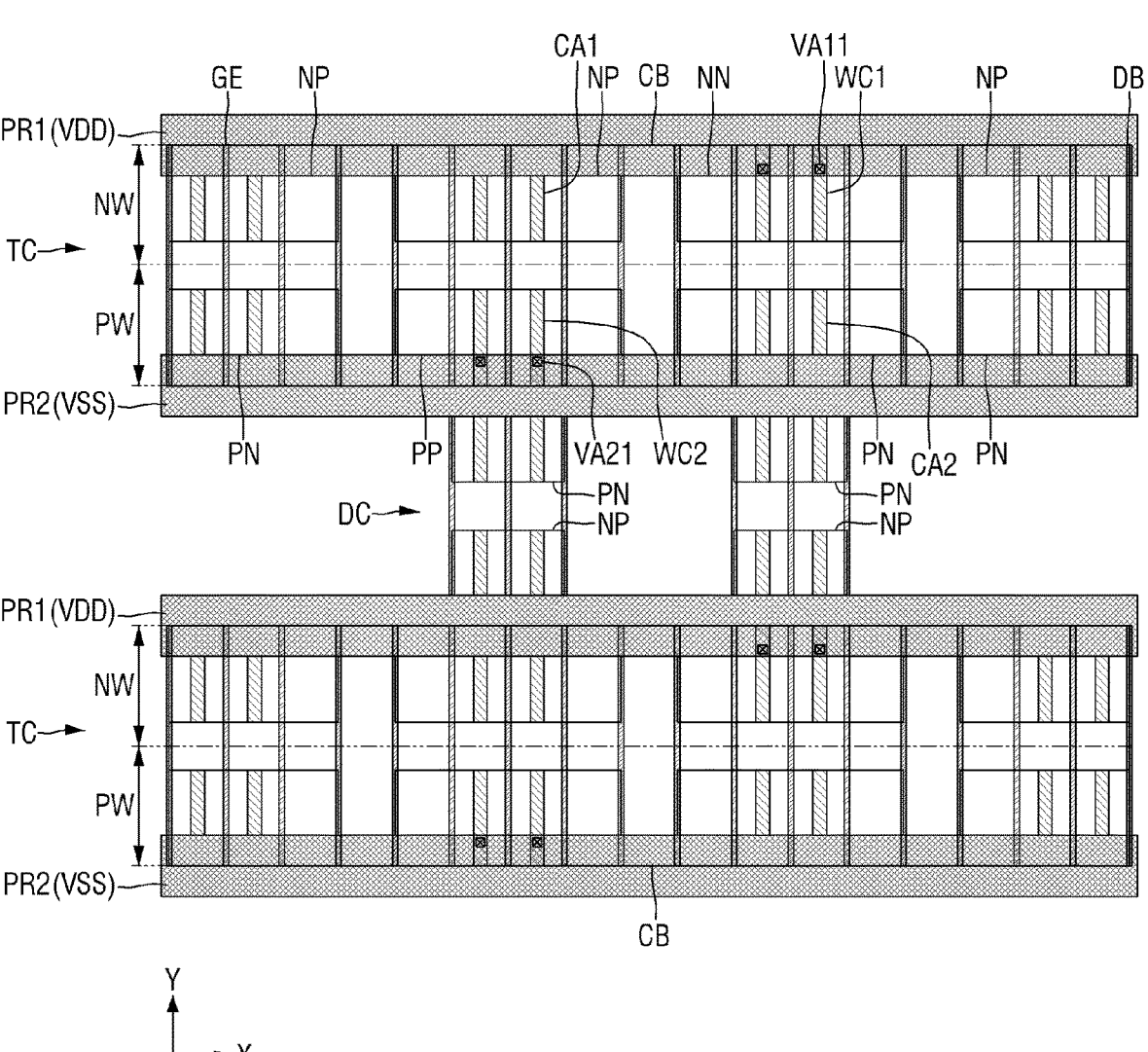
FIGS. 12 and 13 illustrate semiconductor devices according to some embodiments.
Figure 13:
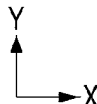

FIG. 9 is a schematic layout view of a tap cell TC according to some embodiments. FIG. 10 is a cross-sectional view taken along line I-I' of FIG. 9. FIG. 11 is a cross-sectional view taken along line II-IF of FIG. 9. FIGS. 12 and 13 illustrate semiconductor devices according to some embodiments. For ease of description, differences from elements and features described with reference to FIGS. 1 through 5 will be mainly described below.

Referring to FIGS. 9 through 11, in the tap cell TC according to the embodiments, a first well tap NN may be connected to a first power rail PR1 through first well contacts WC1 and contact vias VA11, and a second well tap PP may be connected to a second power rail PR2 through second well contacts WC2 and contact vias VA21.

Referring to FIGS. 12 and 13, in each of the semiconductor devices according to the embodiments, tap cells TC may be disposed on a tap cell track extending along the second direction Y. In this case, the tap cells TC may be successively disposed along the tap cell track or may be alternately disposed with dummy cells. Accordingly, first and second source/drain regions of a logic cell do not neighbor first and second well taps NN and PP of a tap cell TC in the second direction Y. The logic cell does not share first and second well contacts WC1 and WC2 of the tap cell TC. The logic cell does not use the first and second well contacts WC1 and WC2 of the tap cell TC as source/drain contacts. Therefore, it is possible to reduce or prevent defects or corrosion of the first and second well contacts WC1 and WC2 and possible to prevent a problem in the operation of the logic cell due to the sharing of the first and second well contacts WC1 and WC2 of the tap cell TC.

The tap cells TC of FIGS. 12 and 13 may be the tap cell TC described with reference to FIGS. 9 through 11.

Referring to FIG. 12, in a semiconductor device according to some embodiments, tap cells TC and dummy cells DC may be alternately disposed along the second direction Y. The tap cells TC may be spaced apart from each other by the dummy cells DC.

For example, the semiconductor device may include a dummy cell DC overlapping a first well tap NN of each tap cell TC in the second direction Y and a dummy cell DC overlapping a second well tap PP of each tap cell TC in the second direction Y. First well contacts WC1 may be cut on a first power rail PR1, and second well contacts WC2 may be cut on a second power rail PR2. As another example, the semiconductor device may include a dummy cell DC extending in the first direction X to overlap the first and second well taps NN and PP in the second direction Y.

Due to the dummy cells DC, a logic cell does not neighbor the first and second well taps NN and PP of a tap cell TC. Accordingly, the logic cell does not share the first and second well contacts WC1 and WC2 with the tap cell TC.

Referring to FIG. 13, in a semiconductor device according to some embodiments, tap cells TC may be arranged along the second direction Y. The tap cells TC may be successively disposed in the second direction Y. The tap cells TC may be disposed such that first well taps NN or second well taps PP neighbor each other in the second direction Y.

The first well taps NN neighboring each other in the second direction Y may share first well contacts WC1, and the second well taps PP neighboring each other in the second direction Y may share second well contacts WC2. The first well contacts WC1 may extend in the second direction Y to lie on the first well taps NN neighboring each other, and the second well contacts WC2 may extend in the second direction Y to lie on the second well taps PP neighboring each other. The first well contacts WC1 may extend in the second direction Y and may be connected to the first well taps NN neighboring each other, and the second well contacts WC2 may extend in the second direction Y and may be connected to the second well taps PP neighboring each other.

FIGS. 14 through 20 illustrate semiconductor devices according to some embodiments. For ease of description, differences from elements and features described with reference to FIGS. FIGS. 1 through 13 will be mainly described below.

Referring to FIGS. 14 through 17, semiconductor devices, according to some embodiments, may each include first ending cells E and tap cells TC. First through third tap cell tracks T1 through T3 may be defined on each of the semiconductor devices. Each of the first through third tap cell tracks T1 through T3 may extend in the second direction Y. The first through third tap cell tracks T1 through T3 may be arranged along the first direction X with a constant pitch. The tap cells TC may be disposed on the first through third tap cell tracks T1 through T3. Logic cells or filler cells may be further disposed in the remaining region of each of the semiconductor devices.

Figure 14:
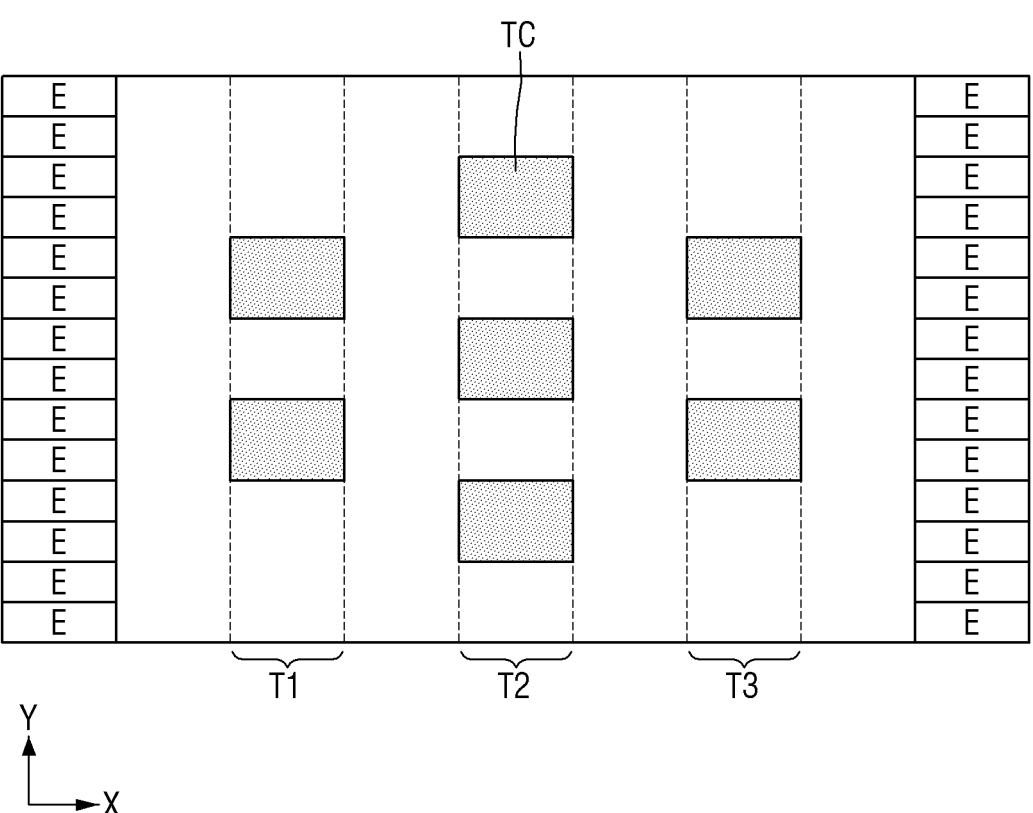
FIGS. 14 through 20 illustrate semiconductor devices according to some embodiments.

Referring to FIG. 14, the tap cells TC may be arranged in a zigzag manner. For example, the tap cells TC may be arranged along the second direction Y on each of the first through third tap cell tracks T1 through T3. The tap cells TC disposed on the second tap cell track T2 may be staggered with the tap cells TC disposed on the first tap cell track T1 and/or the tap cells TC disposed on the third cell track T3.

The tap cells TC may be double height cells. Each of the tap cells TC of FIG. 14 may be the tap cell TC described with reference to FIG. 7.

In some embodiments, the tap cells TC may be triple height cells. Each of the tap cells TC may further include a power rail spaced apart from the second power rail PR2 in the tap cell TC described with reference to FIG. 7 and providing a first voltage VDD and may be defined between the power rail and the third power rail PR3. A $(2\text{-}1)^{th}$ connection wiring M2_I1 and a $(2\text{-}2)^{th}$ connection wiring M2_I2 may each extend between the power rail and the third power rail PR3. A height of each of a first well tap NN and a second well tap PP in the second direction Y may be about twice the height of each of the first well taps NN of FIGS. 1 through 6 in the second direction Y.

Figure 15:
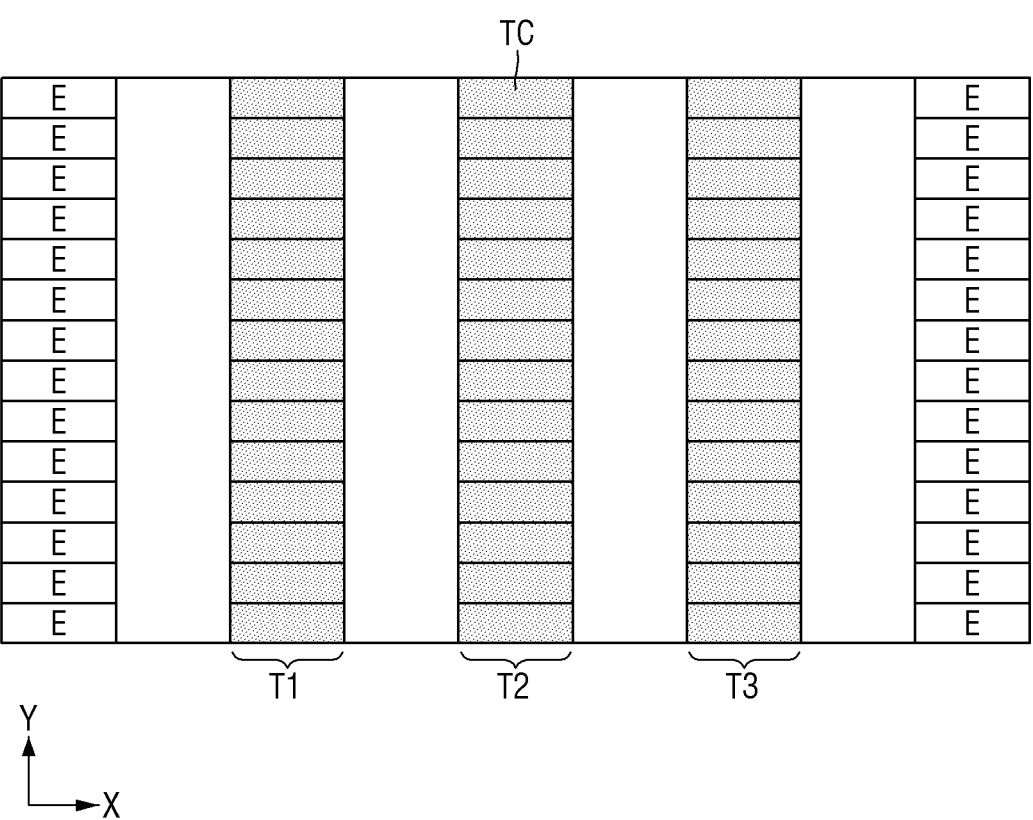
Figure 16:
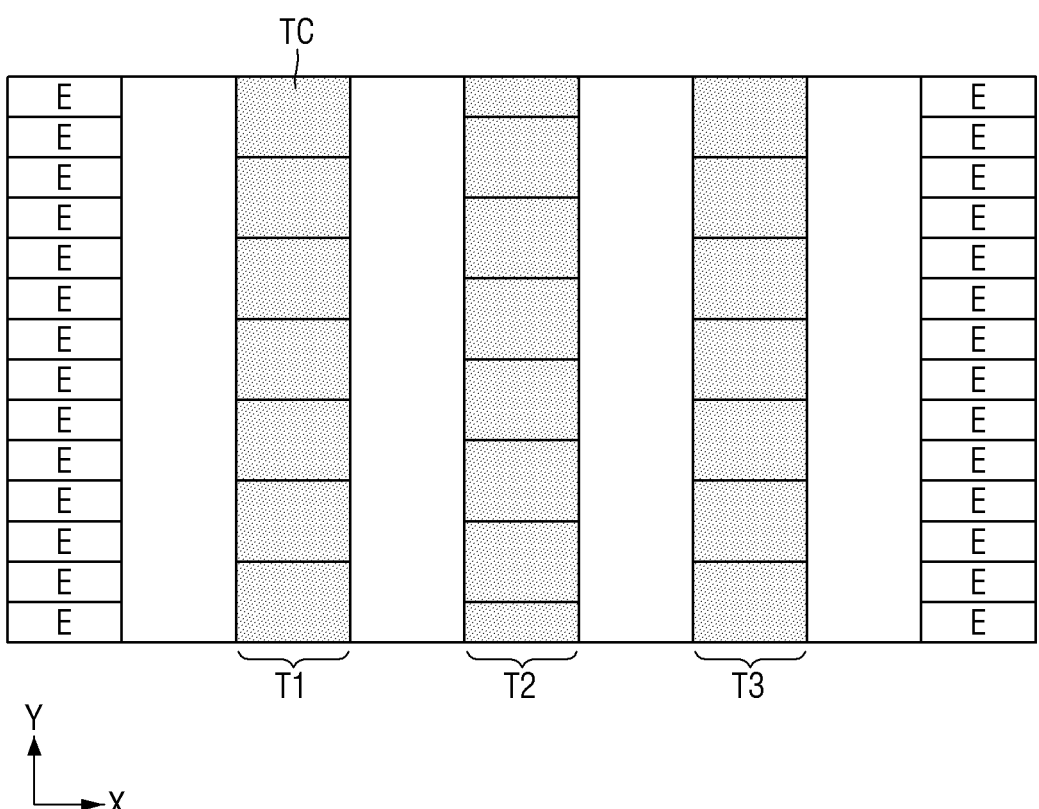

Referring to FIGS. 15 and 16, the tap cells TC may be successively disposed along each of the first through third tap cell tracks T1 through T3. The tap cells TC may be disposed such that first well taps NN or second well taps PP neighbor each other in the second direction Y.

Referring to FIG. 15, the tap cells TC may be single height cells. Each of the tap cells TC of FIG. 15 may be the tap cell TC described with reference to FIG. 5. First well taps NN neighboring each other in the second direction Y may share first well contacts WC1 and a $(2\text{-}1)^{th}$ connection wiring M2_I1, and second well taps PP neighboring each other in the second direction Y may share second well contacts WC2 and a $(2\text{-}2)^{th}$ connection wiring M2_I2. The first well contacts WC1 and the $(2\text{-}1)^{th}$ connection wiring M2_I1 may extend in the second direction Y to lie on the first well taps NN neighboring each other, and the second well contacts WC2 and the $(2\text{-}2)^{th}$ connection wiring M2_I2 may extend in the second direction Y to lie on the second well taps PP neighboring each other.

Referring to FIG. 16, the tap cells TC may be double height cells. Each of the tap cells TC of FIG. 16 may be the tap cell TC described with reference to FIG. 8. First well taps NN neighboring each other in the second direction Y may share first well contacts WC1, and second well taps PP neighboring each other in the second direction Y may share second well contacts WC2. The first well contacts WC1 may extend in the second direction Y to lie on the first well taps NN neighboring each other, and the second well contacts WC2 may extend in the second direction Y to lie on the second well taps PP neighboring each other. A $(2\text{-}1)^{th}$ connection wiring M2_I1 and a $(2\text{-}2)^{th}$ connection wiring M2_I2 may extend in the second direction Y. The $(2\text{-}1)^{th}$ connection wiring M2_I2 may be connected to $(1\text{-}1)^{th}$ connection wirings M1_I1, and the $(2\text{-}2)^{th}$ connection wiring M2_I2 may be connected to $(1\text{-}2)^{th}$ connection wirings M1_I2.

Figure 17:
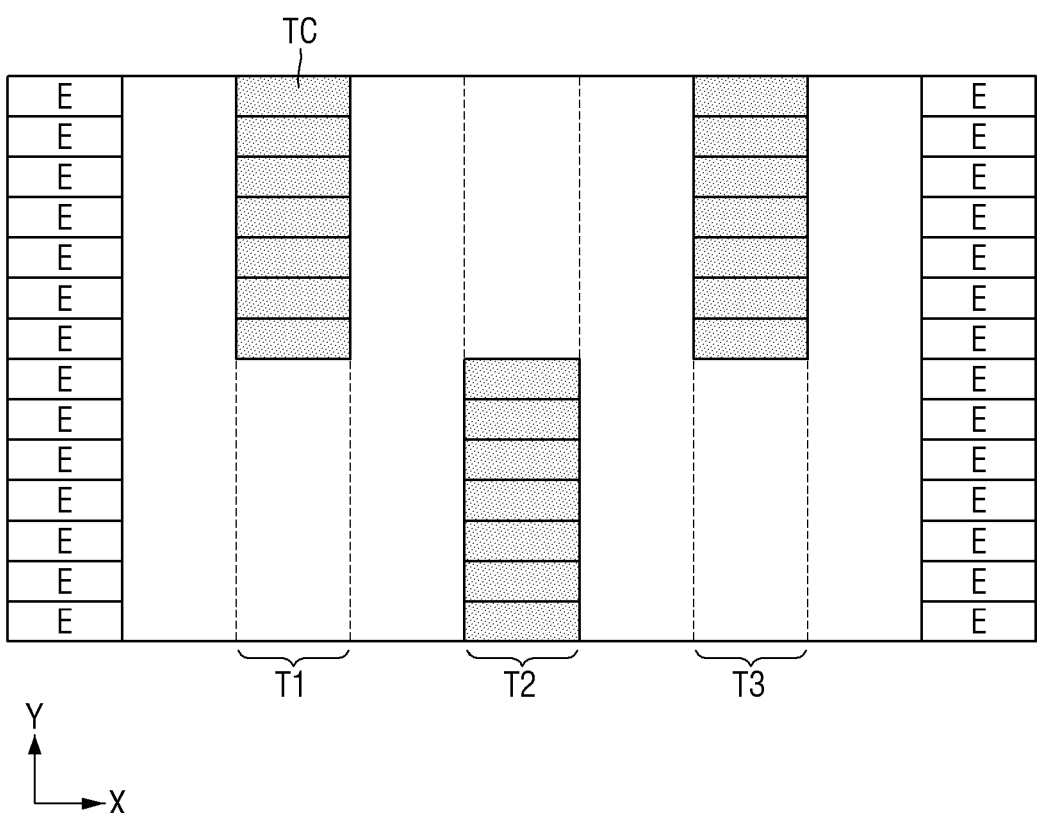

Referring to FIG. 17, the tap cells TC may be successively arranged along a portion of each of the first through third tap cell tracks T1 through T3 but may be arranged in a zigzag manner. For example, the tap cells TC may be disposed along the first tap cell track T1 and the third tap cell track T3 from the top toward the bottom in the second direction Y but may not be disposed up to the bottom. The tap cells TC may be disposed along the second tap cell track T2 from the bottom toward the top in the second direction Y but may not be disposed up to the top. A length by which the tap cells TC are disposed along each of the first through third tap cell tracks T1 through T3 may vary.

The tap cells TC of FIG. 17 may be the tap cells TC described with reference to FIGS. 5 and 15 or the tap cells TC described with reference to FIGS. 8 and 16.

Referring to FIGS. 15 through 17, the first ending cells E may refer to cells disposed around standard cells in order to reduce a proximity effect from neighboring cells. The first ending cells E may be disposed at a right edge and a left edge in the first direction X. The first ending cells E may be successively disposed along the second direction Y.

Figure 18:
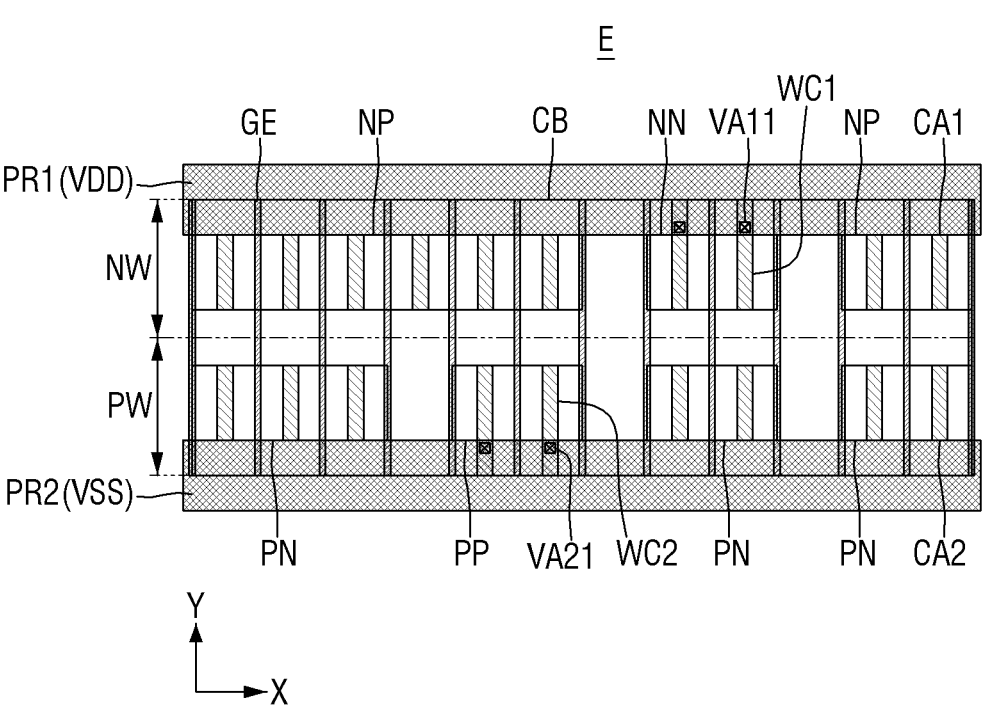

Referring to FIG. 18, a first ending cell E may be disposed between a first power rail PR1 and a second power rail PR2. The first ending cell E may include first source/drain contacts CA1 on each first source/drain region NP of a first well NW and second source/drain contacts CA2 on each second source/drain region PN of a second well PW. The first ending cell E may further include first and second well taps NN and PP. The first well tap NN may receive a first voltage through first well contacts WC1, and the second well tap PP may receive a second voltage through second well contacts WC2.

The first and second well taps NN and PP of the first ending cell E overlap first and second well taps NN and PP of a tap cell TC. Therefore, in a semiconductor device according to some embodiments, the tap cell TC and the first ending cell E may be placed to neighbor each other, and the first and second well taps NN and PP may be omitted from the first ending cell E. This will be described in detail with reference to FIGS. 19 and 20.

Figure 19:
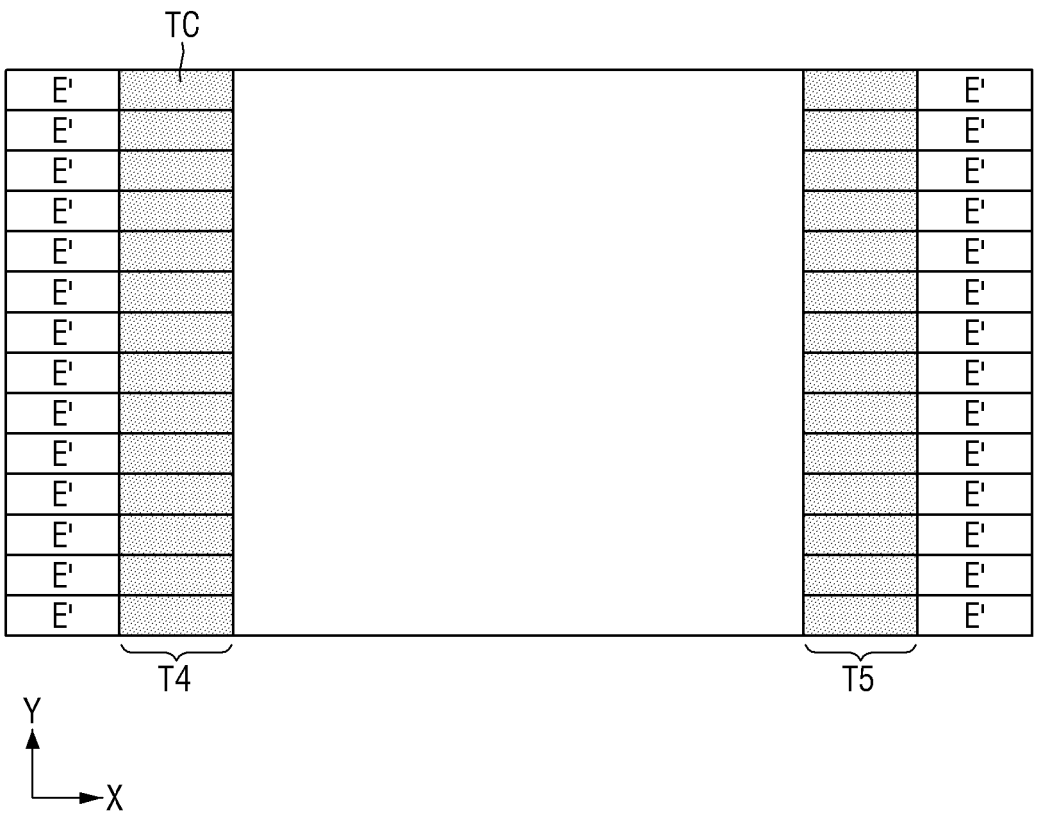
Figure 20:
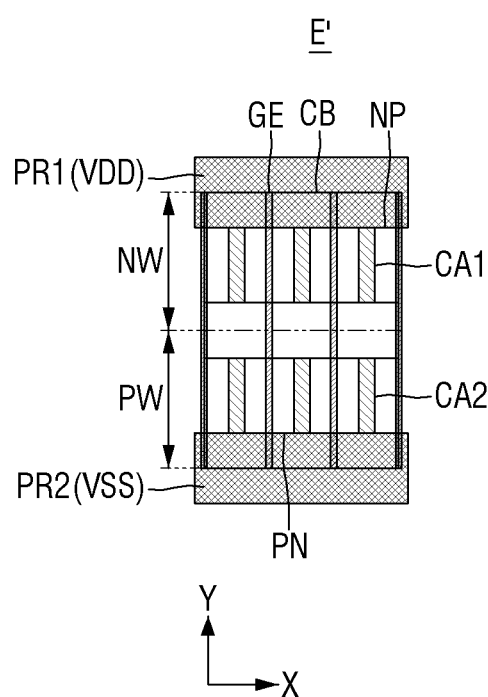

Referring to FIGS. 19 and 20, a semiconductor device according to some embodiments may include second ending cells E' and tap cells TC. Fourth and fifth tap cell tracks T4 and T5 may be defined on the semiconductor device. The fourth and fifth tap cell tracks T4 and T5 may extend in the second direction Y. The tap cells TC may be successively disposed along each of the fourth and fifth tracks T4 and T5. The tap cells TC may be the tap cells TC described with reference to FIGS. 5 and 15. According to some embodiments, the tap cells TC may be the tap cells TC described with reference to FIGS. 8 and 16.

The fourth track T4 may neighbor the second ending cells E' disposed at a left edge in the first direction X, and the fifth track T5 may neighbor the second ending cells E' disposed at a right edge in the first direction X. That is, each of the fourth and fifth tracks T4 and T5 may be closest to the second ending cells E'.

Referring to FIG. 20, a second ending cell E' may be implemented by removing the first and second well taps NN and PP from the first ending cell E described with reference to FIG. 18.

FIGS. 21 through 24 illustrate semiconductor devices according to some embodiments.

Figure 21:
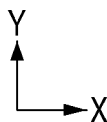
FIGS. 21 through 24 illustrate semiconductor devices according to some embodiments.

Referring to FIG. 21, a semiconductor device according to some embodiments may have various shapes. Ending cells A, B, C, D and G may be disposed at edges of the semiconductor device. The ending cells A may be respectively disposed at corners of the semiconductor device, the ending cells C and D may be disposed at upper and lower edges of the semiconductor device, and the ending cells B and G may be disposed at left and right edges of the semiconductor device.

As described with reference to FIGS. 15 and 16, tap cells TC may be successively disposed along the second direction Y so that a height of a first well tap NN or a second well tap PP in the first direction X is about twice the height of each of the first well taps NN or the second well taps PP of FIGS. 1 through 6 in the first direction X. Therefore, there may be a limitation in arranging logic cells in the remaining region after the tap cells TC are disposed.

Figure 22:
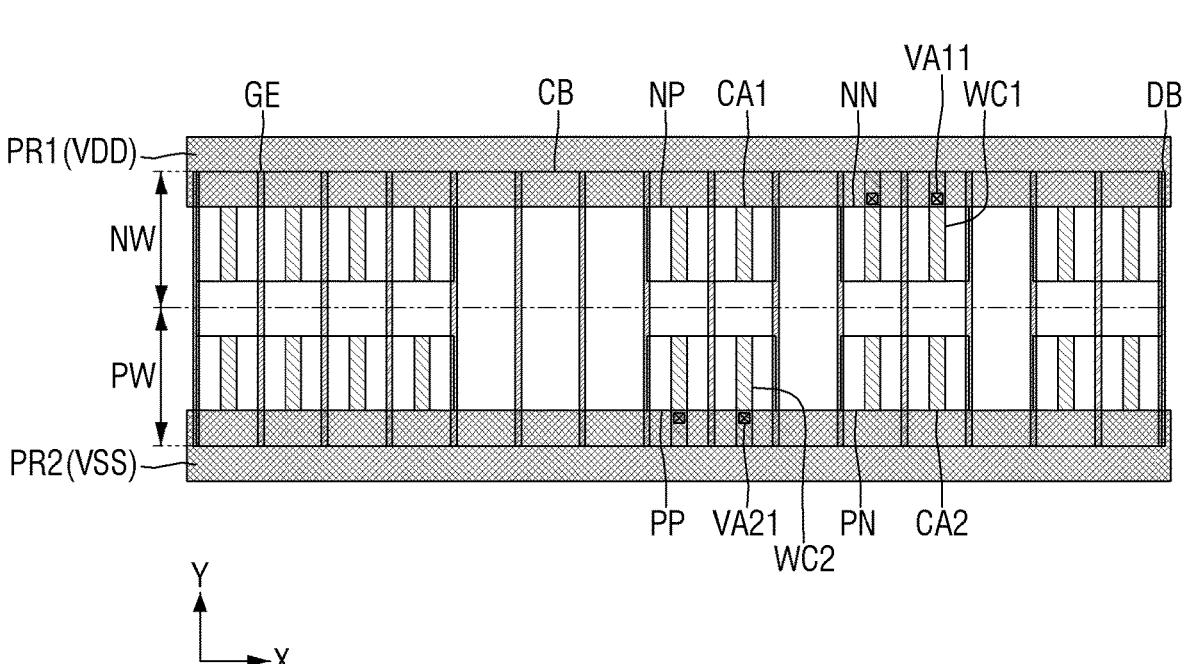

Referring to FIG. 22, an ending cell H may be disposed between a first power rail PR1 and a second power rail PR2. The ending cell H may include first and second well taps NN and PP. Therefore, in a semiconductor device according to some embodiments, the ending cell H disposed at a corner may be changed to a double height cell so that a height of the first well tap NN or the second well tap PP in the second direction Y becomes about twice the height of each of the first well taps NN or the second well taps PP of FIGS. 1 through 6 in the second direction Y. This will be described in detail with reference to FIGS. 23 and 24.

Figure 23:
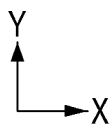
Figure 24:
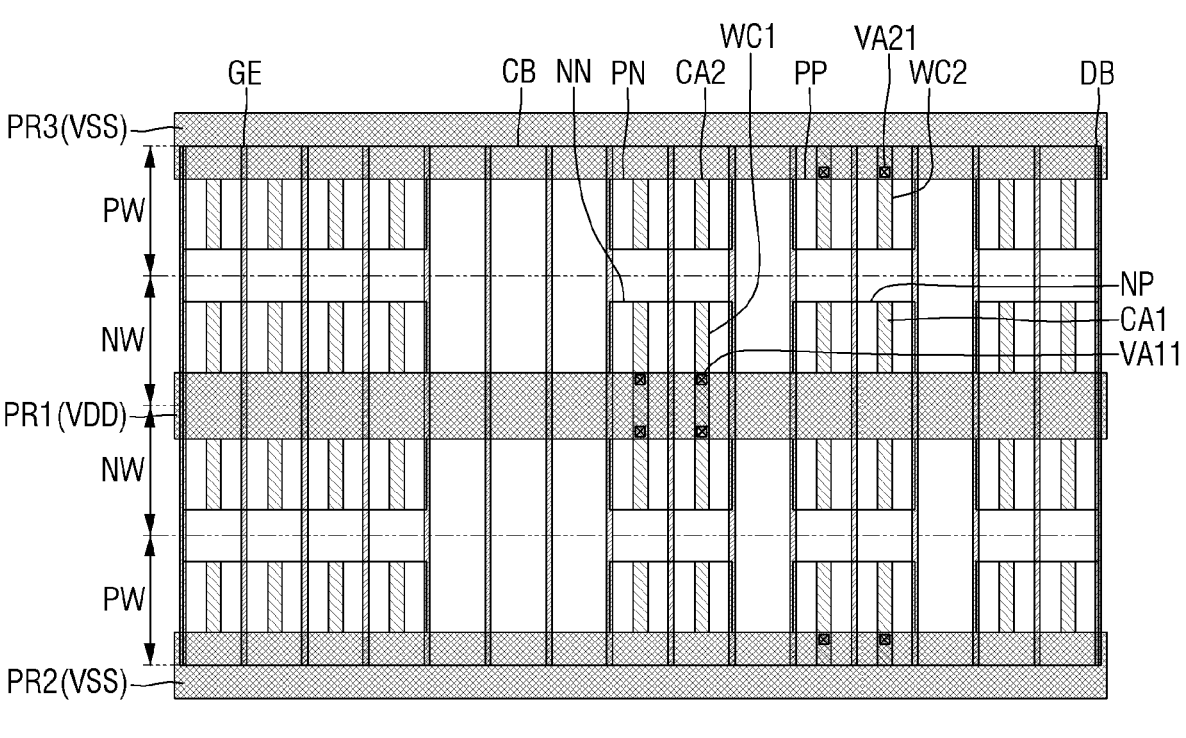
Figure 24:
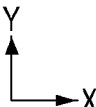

Referring to FIGS. 23 and 24, in a semiconductor device according to some embodiments, an ending cell H' disposed at a corner may be a double height cell. The ending cell H' may be defined between a second power rail PR2 and a third power rail PR3). The ending cell H' may be implemented by placing the ending cells H described with reference to FIG. 22 to neighbor each other in the second direction Y. For example, first well taps NN neighboring each other in the second direction Y may share first well contacts WC1. A height of the first well taps NN may be guaranteed.

In addition, a logic cell may be disposed below the ending cell H' in the second direction Y. Therefore, the degree of freedom for placing the logic cell can be improved or enhanced.

Figure 25:
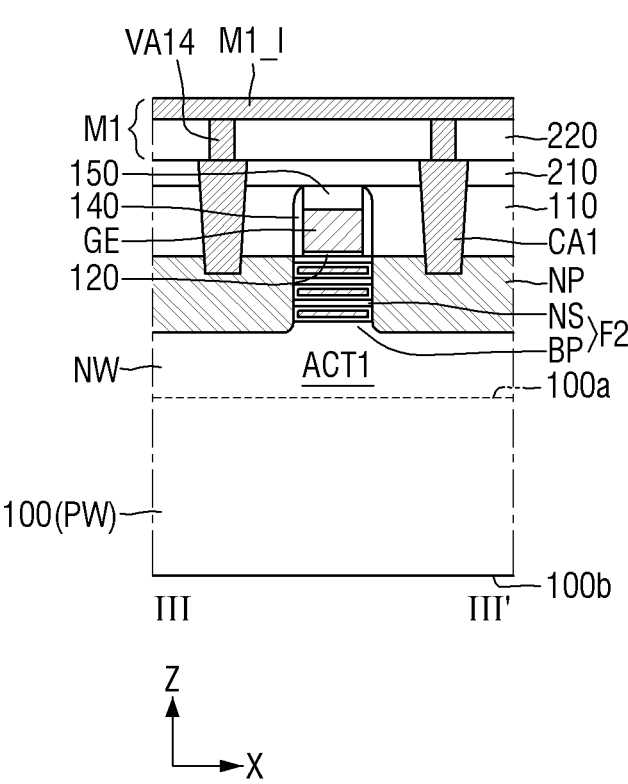
FIGS. 25 through 28 illustrate semiconductor devices according to some embodiments.
Figure 26:
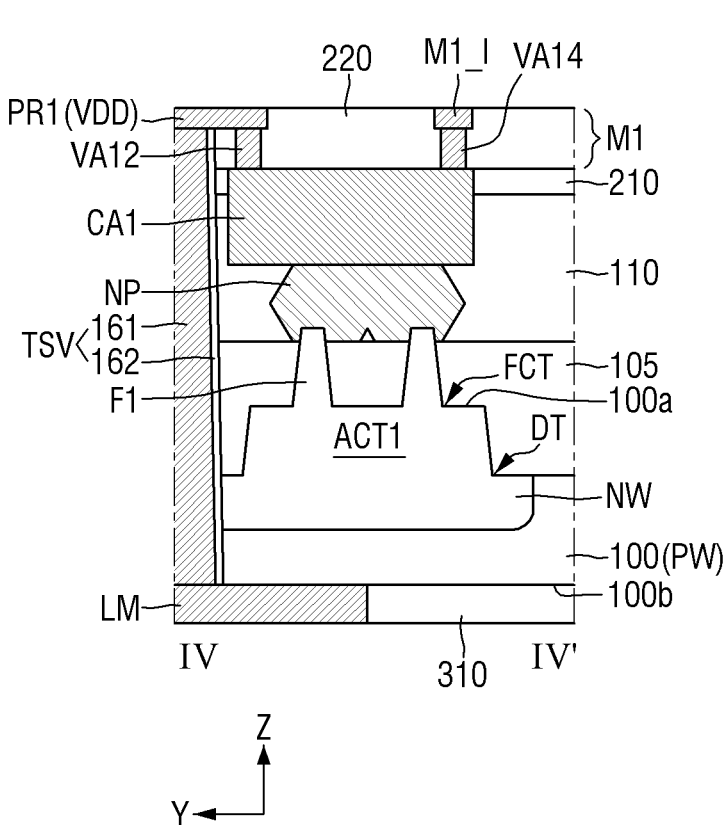
Figure 27:
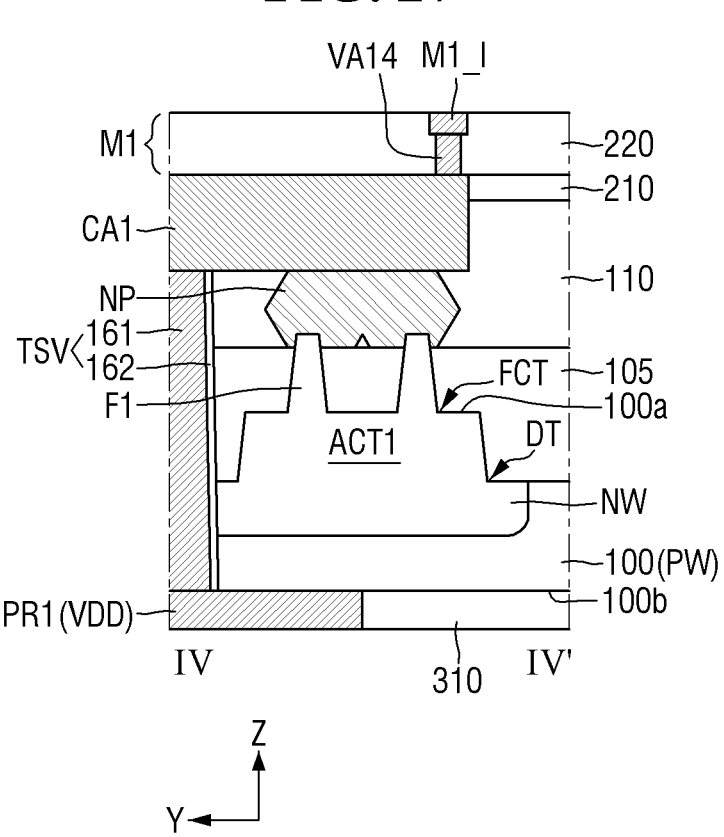
Figure 28:
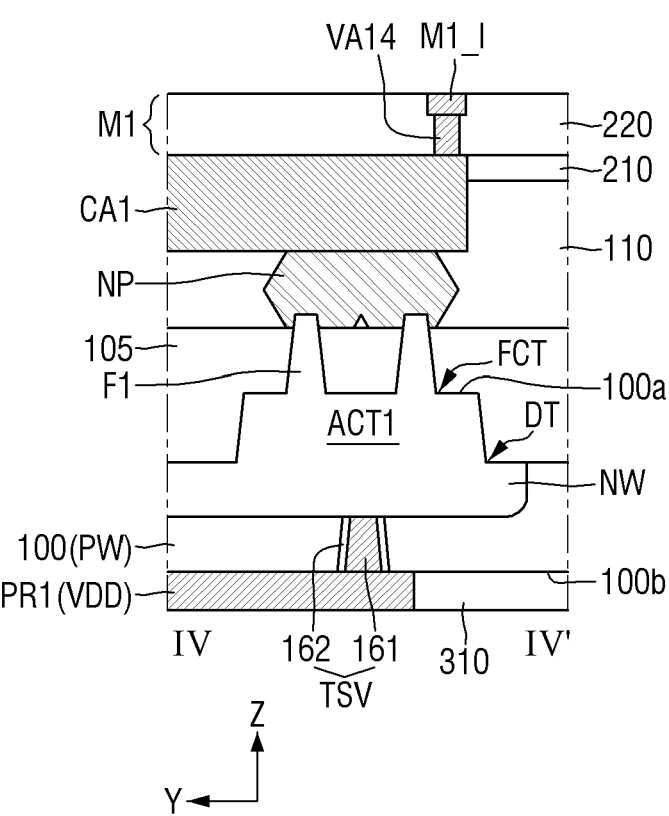

FIGS. 25 through 28 illustrate semiconductor devices according to some embodiments. For reference, FIG. 25 is a cross-sectional view taken along line of FIG. 1. FIGS. 26 through 28 are cross-sectional views taken along line IV-IV' of FIG. 1. For ease of description, differences from elements and features described with reference to FIGS. 1 through 4 will be mainly described below.

Referring to FIG. 25, in a semiconductor device according to some embodiments, a second active pattern F2 may include a bottom pattern BP and a plurality of sheet patterns NS. Like the second active pattern F2, a first active pattern F1 (see FIGS. 1 through 4) may also include a bottom pattern and a plurality of sheet patterns.

The bottom pattern BP may protrude from a first surface 100*a* of a substrate 100. The sheet patterns NS may be spaced apart from the bottom pattern BP in the third direction Z. The sheet patterns NS may be sequentially stacked on the bottom pattern BP and spaced apart from each other in the third direction Z.

The sheet patterns NS may penetrate a gate electrode GE. The gate electrode GE may surround outer circumferential surfaces of the sheet patterns NS. A gate dielectric layer 120 may be disposed between the sheet patterns NS and the gate electrode GE. The gate dielectric layer 120 may surround the outer circumferential surfaces of the sheet patterns NS.

Gate spacers 140 may be disposed between a topmost sheet pattern NS among the sheet patterns NS and a first source/drain region NP and may not be disposed on the sheet patterns NS other than the topmost sheet pattern NS among the sheet patterns NS. That is, inner spacers may be omitted, and only outer spacers may exist on a sheet pattern NS.

Although a cross section of each of the sheet patterns NS is rectangular in the drawing, this is only an example. For example, the cross section of each of the sheet patterns NS may also have another polygonal shape or a circular shape. In some embodiments, unlike in the drawing, widths of the sheet patterns NS may decrease as the distance from the first surface 100*a* of the substrate 100 increases. Although the number of the sheet patterns NS is three in the drawing, this is only an example.

Referring to FIG. 26, in a semiconductor device according to some embodiments, a first power rail PR1 may receive a first voltage VDD from a lower wiring LM through a through via TSV.

A lower insulating layer 310 may be disposed on a second surface 100*b* of a substrate 100. The lower wiring LM may be disposed in the lower insulating layer 310. The through via TSV may extend in the third direction Z. The through via TSV may penetrate the substrate 100, a device isolation layer 105, first and second upper interlayer insulating layers 110 and 210, and a portion of a third upper interlayer insulating layer 220. The through via TSV may connect the lower wiring LM and the first power rail PR1. A width of the through via TSV may decrease as the distance from the lower wiring LM increases, but the present disclosure is not limited thereto.

The through via TSV may include a barrier layer 162 and a filling layer 161. The barrier layer 162 may extend along a sidewall of the filling layer 161. For example, the barrier layer 162 may include, but is not limited to, at least one of titanium (Ti), tantalum (Ta), tungsten (W), nickel (Ni), cobalt (Co), platinum (Pt), alloys thereof, and/or nitrides thereof. For example, the filling layer 161 may include, but is not limited to, at least one of aluminum (Al), copper (Cu), tungsten (W), molybdenum (Mo), cobalt (Co), and/or alloys thereof.

Like the first power rail PR1, a second power rail PR2 (see FIGS. 1 through 4) may receive a second voltage VSS from a lower wiring through a through electrode.

In the tap cell TC described with reference to FIGS. 9 through 11, each of the first power rail PR1 and the second power rail PR2 may also receive a voltage VDD or VSS from a lower wiring through a through electrode.

Referring to FIGS. 27 and 28, in semiconductor devices according to some embodiments, a first power rail PR1 may be disposed on a second surface 100*b* of a substrate 100. A lower insulating layer 310 may be disposed on the second surface 100*b* of the substrate 100. The first power rail PR1 may be disposed in the lower insulating layer 310.

A through via TSV may extend in the third direction Z. The through via TSV may be connected to the power rail PR1. A width of the through via TSV may decrease as the distance from the first power rail PR1 increases, but the present disclosure is not limited thereto. The through via TSV may include a barrier layer 162 and a filling layer 161. Since the barrier layer 162 and the filling layer 161 are similar to those described with reference to FIG. 26, a detailed description thereof will be omitted. A contact via VA12 may be omitted.

Referring to FIG. 27, the through via TSV may penetrate the substrate 100, a device isolation layer 105, and a portion of a first upper interlayer insulating layer 110. The through via TSV may connect the first power rail PR1 and a first source/drain contact CA1. The first power rail PR1 may provide a first voltage VDD to the first source/drain contact CA1 through the through via TSV.

Like the first power rail PR1, a second power rail PR2 (see FIGS. 1 through 4) may also be disposed on the second surface 100*b* of the substrate 100 and may provide a second voltage VSS to a second source/drain contact CA2 (see FIGS. 1 through 4) through a through via.

In the tap cell TC described with reference to FIGS. 9 through 11, the first power rail PR1 and the second power rail PR2 may also be disposed on the second surface 100*b* of the substrate 100 and may provide the voltages VDD and VSS to the source/drain contacts CA1 and CA2 through through vias.

Referring to FIG. 28, in a semiconductor device according to some embodiments, the through via TSV may penetrate a portion of the substrate 100 to connect the first power rail PR1 and a first well NW. The first power rail PR1 may provide a first voltage VDD to the first well NW through the through via TSV. The through via TSV may connect the first well NW, on which a first source/drain region NP is formed, and the first power rail PR1.

Like the first power rail PR1, the second power rail PR2 (see FIGS. 1 through 4) may also be disposed on the second surface 100*b* of the substrate 100 and may provide a second voltage VSS to a second well PW through a through via. The through via may connect the second well PW (see FIGS. 1 through 4), on which a second source/drain region PN is formed, and the second power rail PR2.

In the tap cell TC described with reference to FIGS. 9 through 11, the first power rail PR1 and the second power rail PR2 may also be disposed on the second surface 100*b* of the substrate 100 and may provide the voltages VDD and VSS to the wells NW and PW through through vias. The through vias may connect the wells NW and PW, on which the source/drain regions NP and PN are formed, and the power rails PR1 and PR2.

While the present disclosure has been particularly shown and described with reference to example embodiments thereof, it will be understood by those of ordinary skill in the art that various changes in form and detail may be made therein without departing from the spirit and scope of the present disclosure as defined by the following claims. The example embodiments should be considered in a descriptive sense only and not for purposes of limitation.

What is claimed is:

1. A semiconductor device comprising:

a first power rail configured to provide a first voltage, wherein the first power rail extends in a first direction;

a substrate comprising a first well having a first conductivity type and a second well having a second conductivity type;

a first well tap having the first conductivity type, on the first well;

a first source/drain region having the second conductivity type, on the first well;

a first source/drain contact extending in a second direction and electrically connected to the first power rail, on the first source/drain region;

a first connection wiring electrically connected to the first source/drain contact and extending in the first direction; and a first well contact electrically connected to the first connection wiring, on the first well tap.

2. The semiconductor device of claim 1, wherein the first connection wiring is at a same height as the first power rail with respect to the substrate.

3. The semiconductor device of claim 1, comprising:

a first contact via electrically connecting the first source/drain contact and the first power rail;

a second contact via electrically connecting the first source/drain contact and the first connection wiring; and a third contact via electrically connecting the first connection wiring and the first well contact.

4. The semiconductor device of claim 1, further comprising:

a second power rail configured to provide a second voltage, wherein the second power rail extends in the first direction;

a second well tap having the second conductivity type, on the second well; and a second well contact extending in the second direction and electrically connected to the second power rail, on the second well tap.

5. The semiconductor device of claim 1, wherein the substrate comprises a first surface on which the first well tap is disposed and a second surface opposite the first surface, and wherein the semiconductor device further comprises:

a lower wiring on the second surface of the substrate; and a through via electrically connecting the lower wiring and the first power rail.

6. The semiconductor device of claim 1, wherein the substrate comprises a first surface on which the first well tap is disposed and a second surface opposite the first surface, wherein the first power rail is on the second surface of the substrate, and wherein the semiconductor device further comprises:

a through via electrically connecting the first power rail and the first source/drain contact.

7. The semiconductor device of claim 1, wherein the substrate comprises a first surface on which the first well tap is disposed and a second surface opposite the first surface, wherein the first power rail is on the second surface of the substrate, and wherein the semiconductor device further comprises:

a through via electrically connecting the first power rail and the first well on which the first source/drain region is disposed.

8. The semiconductor device of claim 1, wherein the substrate comprises a fin pattern protruding from the substrate.

9. The semiconductor device of claim 1, further comprising:

a plurality of sheet patterns spaced apart from each other on the substrate.

* * * * *